US011626148B2

(12) United States Patent
Troia

(10) Patent No.: US 11,626,148 B2
(45) Date of Patent: Apr. 11, 2023

(54) ACTIVATION FUNCTIONS FOR ARTIFICIAL INTELLIGENCE OPERATIONS

(71) Applicant: Micron Technology, Inc., Boise, ID (US)

(72) Inventor: Alberto Troia, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/553,957

(22) Filed: Aug. 28, 2019

(65) Prior Publication Data

US 2021/0065754 A1 Mar. 4, 2021

(51) Int. Cl.
G11C 7/10 (2006.01)
G06F 11/36 (2006.01)
G11C 29/12 (2006.01)

(52) U.S. Cl.
CPC .......... G11C 7/1096 (2013.01); G06F 11/362 (2013.01); G11C 7/1072 (2013.01); G11C 29/12 (2013.01)

(58) Field of Classification Search
CPC ... G11C 7/1096; G11C 11/362; G11C 7/1072; G11C 29/12
See application file for complete search history.

(56) References Cited

U.S. PATENT DOCUMENTS

| 7,463,501 | B2 * | 12/2008 | Dosaka | G11C 15/00 365/49.1 |
| 8,966,319 | B2 * | 2/2015 | Fai | G06F 11/362 714/42 |
| 2002/0065646 | A1 * | 5/2002 | Waldie | G06F 11/3648 703/26 |
| 2007/0094168 | A1 | 4/2007 | Ayala et al. | |
| 2017/0024644 | A1 | 1/2017 | Van Der Made et al. | |
| 2017/0103301 | A1 | 4/2017 | Henry et al. | |
| 2018/0121796 | A1 | 5/2018 | Deisher et al. | |
| 2018/0189638 | A1 | 7/2018 | Nurvitadhi et al. | |
| 2019/0042538 | A1 | 2/2019 | Koren et al. | |
| 2019/0080239 | A1 | 3/2019 | Yang | |
| 2019/0094946 | A1 | 3/2019 | Pillilli et al. | |
| 2019/0205737 | A1 | 7/2019 | Bleiweiss et al. | |
| 2019/0235867 | A1 | 8/2019 | Jaffari et al. | |

FOREIGN PATENT DOCUMENTS

KR    10-2019-0030034    3/2019

OTHER PUBLICATIONS

Sebastian et al., "Temporal Correlation Detection Using Computational Phase-change Memory", Nature Communications Journal 8, Article No. 1115, Oct. 24, 2017, pp. 1-10.

(Continued)

*Primary Examiner* — Vanthu T Nguyen
(74) *Attorney, Agent, or Firm* — Brooks, Cameron & Huebsch, PLLC

(57) ABSTRACT

The present disclosure includes apparatuses and methods related to defining activation functions for artificial intelligence (AI) operations. An example apparatus can include a number of memory arrays and a controller, wherein the controller includes a number of activations function registers, wherein the number of activation function registers define activation functions for artificial intelligence (AI) operations performed by the apparatus.

17 Claims, 13 Drawing Sheets

(56) References Cited

OTHER PUBLICATIONS

Rios et al., "In-Memory Computing on a Photonic Platform", Jan. 18, 2018, Cornell University arXiv, retrieved from https://arxiv.org/abs/1801.06228.

"A New Brain-inspired Architecture Could Improve How Computers Handle Data and Advance AI", Oct. 3, 2018, American Institute of Physics, retrieved from https://phys.org/news/2018-10-brain-inspired-architecture-advance-ai.htm.

Mani et al., "RAPIDNN: In-Memory Deep Neural Network Acceleration Framework", Apr. 11, 2019, Cornell University Arxiv, pp. 1-5 and figs. 1-7, retrieved from http://arxiv.org/pdf/1806.05794v4.pdf.

International Search Report and Written Opinion for related PCT Application No. PCT/US2020/048137, dated Dec. 3, 2020, 12 pages.

* cited by examiner

| 230 REGISTERS | |
|---|---|
| REGISTER 0 — AI MODE | REGISTER 26 — DEBUG MODE |
| REGISTER 1 | REGISTER 27 |
| REGISTER 2 | REGISTER 28 — STOP LAYER |
| REGISTER 3 — INPUT | REGISTER 29 |
| REGISTER 4 | REGISTER 30 |
| REGISTER 5 | REGISTER 31 — TEMP BLOCK 1 |
| REGISTER 6 | REGISTER 32 |
| REGISTER 7 | REGISTER 33 — TEMP BLOCK 2 |
| REGISTER 8 | REGISTER 34 |
| REGISTER 9 — OUTPUT | REGISTER 35 |
| REGISTER 10 | REGISTER 36 — ACTIVATION FUNCTIONS |
| REGISTER 11 | REGISTER 37 |
| REGISTER 12 — ENABLE | REGISTER 38 |
| REGISTER 13 | REGISTER 39 |
| REGISTER 14 | REGISTER 40 |
| REGISTER 15 | REGISTER 41 |
| REGISTER 16 | REGISTER 42 — BIAS VALUES |
| REGISTER 17 | REGISTER 43 |
| REGISTER 18 — NEURAL NETWORK | REGISTER 44 |
| REGISTER 19 | REGISTER 45 — STATUS |
| REGISTER 20 | REGISTER 46 — ERROR |
| REGISTER 21 | REGISTER 47 — SELECT ACT. FUNC |
| REGISTER 22 | REGISTER 48 |
| REGISTER 23 | REGISTER 49 — LAYER/NEURON ADDRESS |
| REGISTER 24 | REGISTER 50 |
| REGISTER 25 | |

*Fig. 2*

| 332-0 | BIT 7<br>334-7 | BIT 6<br>334-6 | BIT 5<br>334-5 | BIT 4<br>334-4 | BIT 3<br>334-3 | BIT 2<br>334-2 | BIT 1<br>334-1 | BIT 0<br>334-0 |
|---|---|---|---|---|---|---|---|---|
| 332-1 | | | 360 | 361 | 362 | 363 | 364 | 365 |
| 332-2 | | | RESTART | START | CONTENT VAL. | CLR CONTENT | IN USE | EXIT |
| 332-3 | INPUT SIZE 336 |||||||||
| 332-4 | NUMBER OF INPUTS 367 |||||||||
| 332-5 | INPUT SA 368 |||||||||
| 332-6 | INPUT EA 369 |||||||||
| 332-7 | OUTPUT SIZE 370 |||||||||
| 332-8 | NUMBER OF OUTPUTS 371 |||||||||
| 332-9 | OUTPUT SA 372 |||||||||
| 332-10 | OUTPUT EA 373 |||||||||
| 332-11 | ENABLE TEMP 374 | ENABLE TEMP 375 | ENABLE AF 376 | ENABLE BIAS 377 | ENAB OUTPUT 378 | ENABLE NN 379 | ENABLE INPUT 380 ||
| 332-12 | NUMBER OF ROWS 381 |||||||||
| 332-13 | NUMBER OF COLUMNS 382 |||||||||
| 332-14 | NEURON SIZE 383 |||||||||
| 332-15 | NUMBER OF NEURONS 384 |||||||||
| 332-16 | NEURON SA 385 |||||||||
| 332-17 | NEURON EA 386 |||||||||
| 332-18 | NUMBER OF LAYERS 387 |||||||||

*Fig. 3A*

| BIT 7 334-7 | BIT 6 334-6 | BIT 5 334-5 | BIT 4 334-4 | BIT 3 334-3 | BIT 2 334-2 | BIT 1 334-1 | BIT 0 334-0 |
|---|---|---|---|---|---|---|---|
| | | | | | | | APPLY ACT FNC 391 |
| | | | | | | FORWARD 390 | |
| | | | | | TEMP VALID 389 | | |
| | | | | TEMP VALID 388 | | | |
| | | | STOP LAYER 392 | | | | |
| | TEMP START ADDRESS 393 | | | | TEMP END ADDRESS 394 | | |
| | TEMP START ADDRESS 396 | TEMP SIZE 395 | | | | | |
| ACTIVATION FUNCTION START ADDRESS 3102 | | | | | | HOLD AT LAYER 398 | HOLD AT NEURON 397 / 3101 3110 |
| | | | ACTIVATION FUNCTION X-AXIS RESOLUTION 3104 | | | ENABLE EXT ACT FUNC 399 | ENABLE INT ACT FUNC |
| | | | ACTIVATION FUNCTION Y-AXIS RESOLUTION 3105 | | ACTIVATION FUNCTION END ADDRESS 3103 | | |
| | | | BIAS VALUE SIZE 3106 | | | | |
| | BIAS VALUES START ADDRESS 3108 | | NUMBER OF BIAS VALUES 3107 | | 3111 3112 | FORWARD 3110 | |
| | BIAS VALUES START ADDRESS 3108 | | MATRX CALC 3115 | AI ACCELER 3116 | BUSY 3117 | BIAS VALUES END ADDRESS 3109 3113 3114 | DEBG/ON-HOLD |
| | | | SEQ ERROR | ALGOR ERROR | PAGE ERROR | | ECC USED 3118 |
| CUST ACT FNC 3119 | SELECT ACTIVATION FUNCTION 3120 | | | | | | |
| | | | ADDRESS OF NEURON/LAYER BEING EXECUTED 3121 | | | | |

*Fig. 3B*

| | | | | |
|---|---|---|---|---|
| 6122-1 | Identity | / | $f(x) = x$ | $f'(x) = 1$ | $(-\infty, \infty)$ |
| 6122-2 | Binary step | ⌐ | $f(x) = \begin{cases} 0 & \text{for } x < 0 \\ 1 & \text{for } x \geq 0 \end{cases}$ | $f'(x) = \begin{cases} 0 & \text{for } x \neq 0 \\ ? & \text{for } x = 0 \end{cases}$ | $\{0,1\}$ |
| 6122-3 | Logistic (a.k.a. Sigmoid or Soft step) | ⌠ | $f(x) = \sigma(x) = \dfrac{1}{1+e^{-x}}$ | $f'(x) = f(x)(1 - f(x))$ | $(0,1)$ |
| 6122-4 | TanH | ⌠ | $f(x) = \tanh(x) = \dfrac{(e^x - e^{-x})}{(e^x + e^{-x})}$ | $f'(x) = 1 - f(x)^2$ | $(-1,1)$ |
| 6122-5 | Arc Tan | ⌠ | $f(x) = \tan^{-1}(x)$ | $f'(x) = \dfrac{1}{x^2+1}$ | $(-\tfrac{\pi}{2}, \tfrac{\pi}{2})$ |
| 6122-6 | Softsign | ⌠ | $f(x) = \dfrac{x}{1+|x|}$ | $f'(x) = \dfrac{1}{(1+|x|)^2}$ | $(-1,1)$ |
| 6122-7 | Inverse square root unit (ISRU) | ⌠ | $f(x) = \dfrac{x}{\sqrt{1+\alpha x^2}}$ | $f'(x) = \left(\dfrac{1}{\sqrt{1+\alpha x^2}}\right)^3$ | $(-\tfrac{1}{\sqrt{\alpha}}, \tfrac{1}{\sqrt{\alpha}})$ |
| 6122-8 | Rectified linear unit (ReLU) | ⌐ | $f(x) = \begin{cases} 0 & \text{for } x < 0 \\ x & \text{for } x \geq 0 \end{cases}$ | $f'(x) = \begin{cases} 0 & \text{for } x < 0 \\ 1 & \text{for } x \geq 0 \end{cases}$ | $(0, \infty)$ |
| 6122-9 | Leaky rectified linear unit (Leaky ReLU) | ⌐ | $f(x) = \begin{cases} 0.01x & \text{for } x < 0 \\ x & \text{for } x \geq 0 \end{cases}$ | $f'(x) = \begin{cases} 0.01 & \text{for } x < 0 \\ 1 & \text{for } x \geq 0 \end{cases}$ | $(-\infty, \infty)$ |
| 6122-10 | Parameteric rectified linear unit (PReLU) | ⌐ | $f(\alpha, x) = \begin{cases} \alpha x & \text{for } x < 0 \\ x & \text{for } x \geq 0 \end{cases}$ | $f'(\alpha, x) = \begin{cases} \alpha & \text{for } x < 0 \\ 1 & \text{for } x \geq 0 \end{cases}$ | $(-\infty, \infty)$ |
| 6122-11 | Randomized leaky rectified linear unit (RReLU) | ⌐ | $f(\alpha, x) = \begin{cases} \alpha x & \text{for } x < 0 \\ x & \text{for } x \geq 0 \end{cases}$ | $f'(\alpha, x) = \begin{cases} \alpha & \text{for } x < 0 \\ 1 & \text{for } x \geq 0 \end{cases}$ | $(-\infty, \infty)$ |
| 6122-12 | Exponential linear unit (ELU) | ⌐ | $f(\alpha, x) = \begin{cases} \alpha(e^x - 1) & \text{for } x < 0 \\ x & \text{for } x \geq 0 \end{cases}$ | $f'(\alpha, x) = \begin{cases} f(\alpha, x) + \alpha & \text{for } x < 0 \\ 1 & \text{for } x \geq 0 \end{cases}$ | $(-\alpha, \infty)$ |
| 6122-13 | Scaled exponential linear unit (SELU) | ⌐ | $f(\alpha, x) = \lambda \begin{cases} \alpha(e^x - 1) & \text{for } x < 0 \\ x & \text{for } x \geq 0 \end{cases}$ with $\lambda = 1.0507$ and $\alpha = 1.67326$ | $f'(\alpha, x) = \lambda \begin{cases} \alpha(e^x) & \text{for } x < 0 \\ 1 & \text{for } x \geq 0 \end{cases}$ | $(-\lambda\alpha, \infty)$ |

Fig. 6

ACTIVATION FUNCTIONS FOR ARTIFICIAL INTELLIGENCE OPERATIONS

TECHNICAL FIELD

The present disclosure relates generally to memory devices, and more particularly, to apparatuses and methods for defining activation functions for artificial intelligence (AI) operations.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be uses as main memory in computing systems.

BRIEF DESCRIPTION OF THE DRAWINGS

FIG. 2 is a block diagram of a number of registers on a memory device with an artificial intelligence (AI) accelerator in accordance with a number of embodiments of the present disclosure.

FIGS. 3A and 3B are block diagrams of a number of bits in a number of registers on a memory device with an artificial intelligence (AI) accelerator in accordance with a number of embodiments of the present disclosure.

FIG. 6 is a table illustrating a number of activation functions for artificial intelligence (AI) operations in accordance with a number of embodiments of the present disclosure.

DETAILED DESCRIPTION

Figure 1:
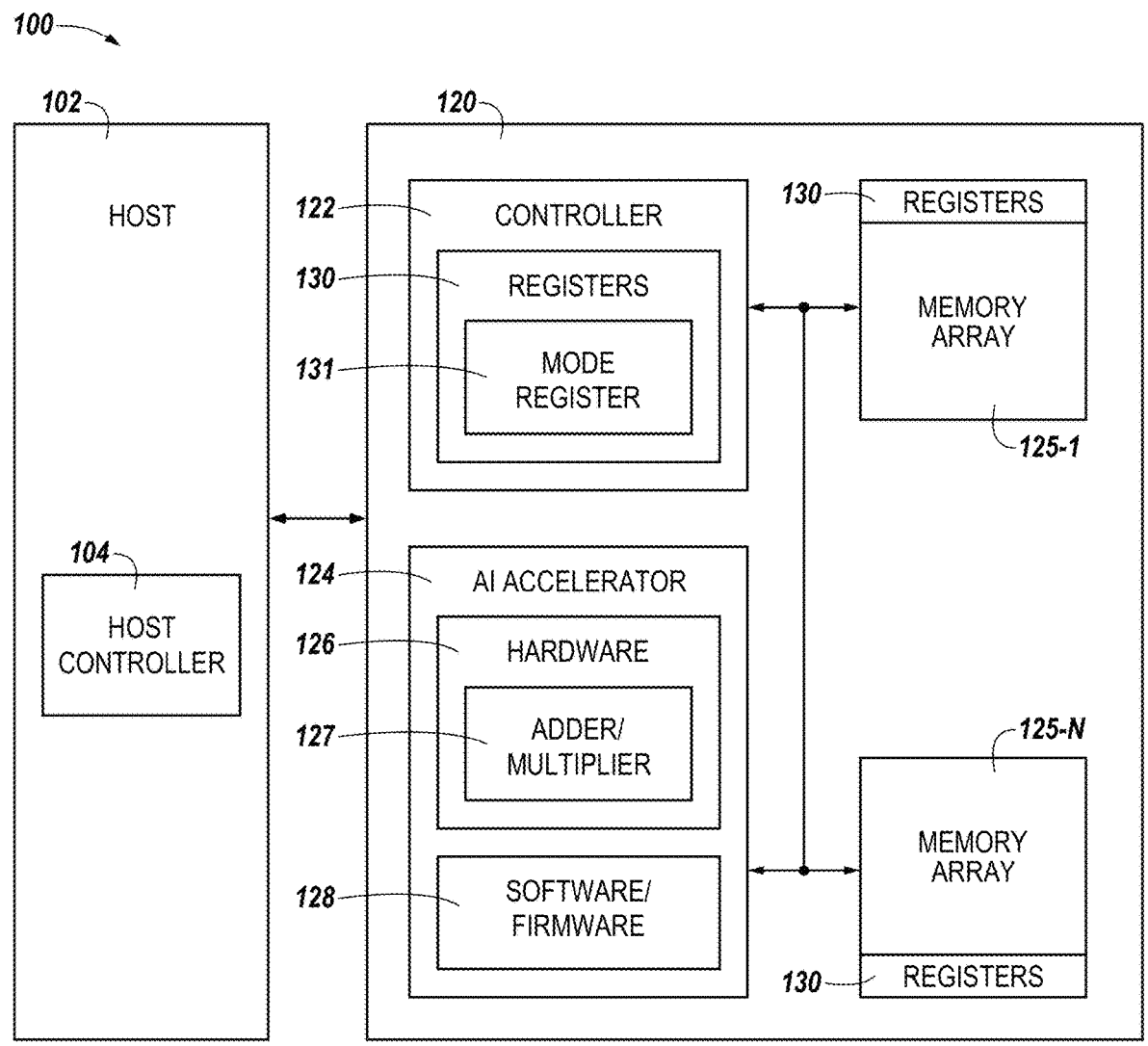
FIG. 1 is a block diagram of an apparatus in the form of a computing system including a memory device with an artificial intelligence (AI) accelerator in accordance with a number of embodiments of the present disclosure.

The present disclosure includes apparatuses and methods related to defining and selecting activation functions for artificial intelligence (AI) operations. An example apparatus can include a number of memory arrays and a controller including a number of activation function registers, wherein the number of activation function registers define activation functions for AI operations performed by the apparatus.

In a number of embodiments, the activation functions can be pre-defined activation functions and/or custom activation functions. The pre-defined activation function can include, but are not limited to, an identity function (e.g., identity relation, identity map, and/or identity transformation), a binary step function, a logistic function, a hyperbolic tangent function (e.g., tan H), an inverse tangent function (e.g., ArcTan), a softsign function, an inverse square root unit (ISRU) function, a rectified linear unit (ReLU) function, a leaky rectified linear unit (Leaky ReLU) function, a parametric rectified linear unit (PReLU) function, a randomized leaky rectified linear unit (RReLU) function, an exponential linear unit (ELU) function, and/or a scaled exponential linear unit (SELU) function, among other functions.

The AI operations can include updating, changing, and/or creating activation functions (e.g., custom activation functions). A custom activation function can be created based on a result of a previous AI operation. For example, a custom activation function can be based on a result of a debug operation. Selecting a custom activation function can improve the functionality and efficiency of the AI operations.

In some examples, the apparatus can be a memory device of a computing system. The activation function registers on the memory device can reduce latency and power consumption when defining activation function for AI operations compared to a host defining activation functions for the memory device. Host defined activation functions are exchanged between the memory device and the host, which adds latency and power consumption to the process of selecting and using an activation function in AI operations. While defining activation functions according to the present disclosure can be performed on the memory device, where data is not transferred from the memory device. For example, the memory device can process data and select an activation function to execute based on the processed data without sending data to a host and without receiving an activation function from a host.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 120 in accordance with a number of embodiments of the present disclosure. As used herein, a memory device 120, memory arrays 125-1, . . . 125-N, memory controller 122, and/or AI accelerator 124 might also be separately considered an "apparatus."

As illustrated in FIG. 1, host 102 can be coupled to the memory device 120. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory device 120. The host controller 108 can send commands to the memory device 120. The host controller 108 can communicate with the memory device 120, memory controller 122 on memory device 120, and/or the AI accelerator 124 on memory device 120 to perform AI operations, read data, write data, and/or erase data, among other operations. AI accelerator 124 can also include components described in associated with FIGS. 7A-10B that are configured to perform AI operations. AI operations may include machine learning or neural network operations, which may include training operations or inference operations, or both. In some example, each memory device 120 may represent a layer within a neural network or deep neural network (e.g., a network having three or more hidden layers). Or each memory device 120 may be or include nodes of a neural network, and a layer of the neural network may be composed of multiple memory devices or portions of several memory devices 120. Memory devices 120 may store weights (or models) for AI operations in memory arrays 125.

A physical host interface can provide an interface for passing control, address, data, and other signals between memory device 120 and host 102 having compatible receptors for the physical host interface. The signals can be communicated between host 102 and memory device 120 on a number of buses, such as a data bus and/or an address bus, for example.

Memory device 120 can include controller 120, AI accelerator 124, and memory arrays 125-1, . . . , 125-N. Memory device 120 can be a low-power double data rate dynamic random access memory, such as a LPDDR5 device, and/or a graphics double data rate dynamic random access memory, such as a GDDR6, GDDR7, LPDDR6, DDR4, among other types of devices. Memory arrays 125-1, . . . , 125-N can include a number of memory cells, such as volatile memory cells (e.g., DRAM memory cells, among other types of volatile memory cells) and/or non-volatile memory cells (e.g., RRAM memory cells, among other types of non-volatile memory cells). Memory device 120 can read and/or write data to memory arrays 125-1, . . . , 125-N. Memory arrays 125-1, . . . , 125-N can store data that is used during AI operations performed on memory device 120. Memory arrays 125-1, . . . , 125-N can store inputs, outputs, weight matrix and bias information of neural network, and/or activation functions information used by the AI accelerator to perform AI operations on memory device 120.

The host controller 108, memory controller 122, and/or AI accelerator 124 on memory device 120 can include control circuitry, e.g., hardware, firmware, and/or software. In one or more embodiments, the host controller 108, memory controller 122, and/or AI accelerator 124 can be an application specific integrated circuit (ASIC) coupled to a printed circuit board including a physical interface Registers 130 can be located on memory controller 122, AI accelerator 124, and/or in memory arrays 125-1, . . . , 125-N and be accessible by controller 122. Also, memory controller 122 on memory device 120 can include registers 130. Registers 130 can be programmed to provide information for the AI accelerator to perform AI operations. Registers 130 can include any number of registers. Registers 130 can be written to and/or read by host 102, memory controller 122, and/or AI accelerator 124. Registers 130 can provide input, output bias, neural network, and/or activation functions information for AI accelerator 124. Registers 130 can include mode register 131 to select a mode of operation for memory device 120. The AI mode of operation can be selected by writing a word to register 131, such as 0xAA and/or 0x2AA, for example, which inhibits access to the registers associated with normal operation of memory device 120 and allows access to the registers associated with AI operations. Also, the AI mode of operation can be selected using a signature that uses a crypto algorithm that is authenticated by a key stored in the memory device 120.

AI accelerator 124 can include hardware 126 and/or software/firmware 128 to perform AI operations. Also, AI accelerator 124 can also include components described in associated with FIGS. 7A-10B that are configured to perform AI operations. Hardware 126 can include adder/multiplier 126 to perform logic operations associated with AI operations. Memory controller 122 and/or AI accelerator 124 can received commands from host 102 to perform AI operations. Memory device 120 can perform the AI operations requested in the commands from host 102 using the AI accelerator 124, data in memory arrays 125-1, . . . , 125-N, and information in registers 130. The memory device can report back information, such as results and/or error information, for example, of the AI operations to host 120. The AI operations performed by AI accelerator 124 can be performed without use of an external processing resource.

The memory arrays 125-1, . . . , 125-N can provide main memory for the memory system or could be used as additional memory or storage throughout the memory system. Each memory array 125-1, . . . , 125-N can include a number of blocks of memory cells. The blocks of memory cells can be used to store data that is used during AI operations performed by memory device 120. Memory arrays 125-1, . . . , 125-N can include DRAM memory cells, for example. Embodiments are not limited to a particular type of memory device. For instance, the memory device can include RAM, ROM, DRAM, SDRAM, PCRAM, RRAM, 3D XPoint, and flash memory, among others.

By way of example, memory device 120 may perform an AI operation that is or includes one or more inference steps. Memory arrays 125 may be layers of a neural network or may each be individual nodes and memory device 120 may be layer; or memory device 120 may be a node within a larger network. Additionally or alternatively, memory arrays 125 may store data or weights, or both, to be used (e.g., summed) within a node. Each node (e.g., memory array 125) may combine an input from data read from cells of the same or a different memory array 125 with weights read from cells of memory array 125. Combinations of weights and data may, for instance, be summed within the periphery of a memory array 125 or within hardware 126 using adder/multiplier 127. In such cases, the summed result may be passed to an activation function represented or instantiated in the periphery of a memory array 125 or within hardware 126. The result may be passed to another memory device 120 or may be used within AI accelerator 124 (e.g., by software/firmware 128) to make a decision or to train a network that includes memory device 120.

A network that employs memory device 120 may be capable of or used for supervised or unsupervised learning. This may be combined with other learning or training regimes. In some cases, a trained network or model is imported or used with memory device 120, and memory device's 120 operations are primarily or exclusively related to inference.

The embodiment of FIG. 1 can include additional circuitry that is not illustrated so as not to obscure embodiments of the present disclosure. For example, memory device 120 can include address circuitry to latch address signals provided over I/O connections through I/O circuitry. Address signals can be received and decoded by a row decoder and a column decoder to access the memory arrays 125-1, . . . , 125-N. It will be appreciated by those skilled in the art that the number of address input connections can depend on the density and architecture of the memory arrays 125-1, . . . , 125-N.

FIG. 2 is a block diagram of a number of registers on a memory device with an artificial intelligence (AI) accelerator in accordance with a number of embodiments of the present disclosure. Registers 230 can be AI registers and include input information, output information, neural network information, and/or activation functions information, among other types of information, for use by an AI accelerator, a controller, and/or memory arrays of a memory device (e.g., AI accelerator 124, memory controller 122, and/or memory arrays 125-1, . . . , 125-N in FIG. 1). Registers can be read and/or written to based on commands from a host, an AI accelerator, and/or a controller (e.g., host 102, AI accelerator 124, memory controller 122 in FIG. 1).

Register 232-0 can define parameters associated with AI mode of the memory device. Bits in register 232-0 can start AI operations, restart AI operations, indicate content in registers is valid, clear content from registers, and/or exit from AI mode.

Registers 232-1, 232-2, 232-3, 232-4, and 232-5 can define the size of inputs used in AI operations, the number of inputs used in AI operations, and the start address and end address of the inputs used in AI operations. Registers 232-7, 232-8, 232-9, 232-10, and 232-11 can define the size of outputs of AI operations, the number of outputs in AI operations, and the start address and end address of the outputs of AI operations.

Register 232-12 can be used to enable the usage of the input blocks, the neuron blocks, the output blocks, the bias blocks, the activation functions, and the temporary blocks used during AI operations.

Registers 232-13, 232-14, 232-15, 232-16, 232-17, 232-18, 232-19, 232-20, 232-21, 232-22, 232-23, 232-24, and 232-25 can be used to define the neural network used during AI operations. Registers 232-13, 232-14, 232-15, 232-16, 232-17, 232-18, 232-19, 232-20, 232-21, 232-22, 232-23, 232-24, and 232-25 can define the size, number, and location of neurons and/or layers of the neural network used during AI operations.

Register 232-26 can enable a debug/hold mode of the A accelerator and output to be observed at a layer of AI operations. Register 232-26 can indicate that an activation should be applied during AI operations and that the AI operation can step forward (e.g., perform a next step in an AI operation) in AI operations. Register 232-26 can indicate that the temporary blocks, where the output of the layer is located, is valid. The data in the temporary blocks can be changed by a host and/or a controller on the memory device, such that the changed data can be used in the AI operation as the AI operation steps forward. Registers 232-27, 232-28, and 232-29 can define the layer where the debug/hold mode will stop the AI operation, change the content of the neural network, and/or observe the output of the layer.

Registers 232-30, 232-31, 232-32, and 232-33 can define the size of temporary blocks used in AI operations and the start address and end address of the temporary blocks used in AI operations. Register 232-30 can define the start address and end address of a first temporary block used in AI operations and register 232-33 can define the start address and end address of a first temporary block used in AI operations. Registers 232-31, and 232-32 can define the size of the temporary blocks used in AI operations.

Registers 232-34, 232-35, 232-36, 232-37, 232-38, and 232-39 can be associated with the activation functions used in AI operations. Register 232-34 can enable usage of the activation function block, enable usage of the activation function for each neuron, the activation function for each layer, and enables usage of an external activation function. Registers 232-35 can define the start address and the end address of the location of the activation functions. Registers 232-36, 232-37, 232-38, and 232-39 can define the resolution of the inputs (e.g., x-axis) and outputs (e.g., y-axis) of the activation functions and/or a custom defined activation function.

Registers 232-40, 232-41, 232-42, 232-43, and 232-44 can define the size of bias values used in AI operations, the number of bias values used in AI operations, and the start address and end address of the bias values used in AI operations.

Register 232-45 can provide status information for the AI calculations and provide information for the debug/hold mode. Register 232-45 can enable debug/hold mode, indicate that the AI accelerator is performing AI operations, indicate that the full capability of the AI accelerator should be used, indicate only matrix calculations of the AI operations should be made, and/or indicate that the AI operation can proceed to the next neuron and/or layer.

Register 232-46 can provide error information regarding AI operations. Register 232-46 can indicate that there was an error in a sequence of an AI operation, that there was an error in an algorithm of an AI operations, that there was an error in a page of data that ECC was not able to correct, and/or that there was an error in a page of data that ECC was able to correct.

Register 232-47 can indicate an activation function to use in AI operations. Register 232-47 can indicated one of a number of pre-define activation function can be used in AI operations and/or a custom activation function located in a block can be used in AI operations.

Registers 232-48, 232-49, and 232-50 can indicate the neuron and/or layer where the AI operation is executing. In the case where errors occur during the AI operations, registers 232-48, 232-49, and 232-50 can store the location of the neuron and/or layer where an error occurred.

FIGS. 3A and 3B are block diagrams of a number of bits in a number of registers on a memory device with an artificial intelligence (AI) accelerator in accordance with a number of embodiments of the present disclosure. Each register 332-0, . . . , 332-50 can include a number of bits, bits 334-0, 334-1, 334-2, 334-3, 334-4, 334-5, 334-6, and 334-7, to indicate information associated with performing AI operations. The number of registers can include 8 bits to store the information associated with performing the AI operations; however, the number of registers can include any number of bits based on a size of the memory including the AI accelerator.

Register 332-0 can define parameters associated with AI mode of the memory device. Bit 334-5 of register 332-0 can be a read/write bit and can indicate that an elaboration of an AI operation can restart 360 at the beginning when programmed to 1b, for example, although other programming conventions can be used. Bit 334-5 of register 332-0 can be reset to 0b once the AI operation has restarted. Bit 334-4 of register 332-0 can be a read/write bit and can indicate that an elaboration of an AI operation can start 361 when programmed to 1b. Bit 334-4 of register 332-0 can be reset to 0b once the AI operation has started.

Bit 334-3 of register 332-0 can be a read/write bit and can indicate that the content of the AI registers is valid 362 when programmed to 1b and invalid when programmed to 0b. Bit 334-2 of register 332-0 can be a read/write bit and can indicate that the content of the AI registers is to be cleared 363 when programmed to 1b. Bit 334-1 of register 332-0 can be a read only bit and can indicate that the AI accelerator is in use 363 and performing AI operations when programmed to 1b. Bit 334-0 of register 332-0 can be a write only bit and can indicate that the memory device is to exit 365 AI mode when programmed to 1b.

Registers 332-1, 332-2, 332-3, 332-4, and 332-5 can define the size of inputs used in AI operations, the number of inputs used in AI operations, and the start address and end address of the inputs used in AI operations. Bits 334-0, 334-1, 334-2, 334-3, 334-4, 334-5, 334-6, and 334-7 of registers 332-1 and 332-2 can define the size of the inputs 366 used in AI operations. The size of the inputs can indicate the width of the inputs in terms of number of bits and/or the type of input, such as floating point, integer, and/or double, among other types. Bits 334-0, 334-1, 334-2, 334-3, 334-4, 334-5, 334-6, and 334-7 of registers 332-3 and 332-4 can indicate the number of inputs 367 used in AI operations. Bits 334-4, 334-5, 334-6, and 334-7 of register 332-5 can indicate a start address 368 of the blocks in memory arrays of the inputs used in AI operations. Bits 334-0, 334-1, 334-2, and 334-3 of register 332-5 can indicate an end address 369 of the blocks in memory arrays of the inputs used in AI operations. If the start address 368 and the end address 369 is the same address, only one block of input is indicated for the AI operations.

Registers 332-7, 332-8, 332-9, 332-10, and 332-11 can define the size of outputs of AI operations, the number of outputs in AI operations, and the start address and end address of the outputs of AI operations. Bits 334-0, 334-1, 334-2, 334-3, 334-4, 334-5, 334-6, and 334-7 of registers 332-7 and 332-8 can define the size 370 of the outputs used in AI operations. The size of the outputs can indicate the width of the outputs in terms of number of bits and/or the type of output, such as floating point, integer, and/or double, among other types. Bits 334-0, 334-1, 334-2, 334-3, 334-4, 334-5, 334-6, and 334-7 of registers 332-9 and 332-10 can indicate the number of outputs 371 used in AI operations. Bits 334-4, 334-5, 334-6, and 334-7 of register 332-11 can indicate a start address 372 of the blocks in memory arrays of the outputs used in AI operations. Bits 334-0, 334-1, 334-2, and 334-3 of register 332-11 can indicate an end address 373 of the blocks in memory arrays of the outputs used in AI operations. If the start address 372 and the end address 373 is the same address, only one block of output is indicated for the AI operations.

Register 332-12 can be used to enable the usage of the input blocks, the neuron blocks, the output blocks, the bias blocks, the activation functions, and the temporary blocks used during AI operations. Bit 334-0 of register 332-12 can enable the input blocks 380, bit 334-1 of register 332-12 can enable the neural network blocks 379, bit 334-2 of register 332-12 can enable the output blocks 378, bit 334-3 of register 332-12 can enable the bias blocks 377, bit 334-4 of register 332-12 can enable the activation function blocks 376, and bit 334-5 and 334-6 of register 332-12 can enable a first temporary 375 blocks and a second temporary block 374.

Registers 332-13, 332-14, 332-15, 332-16, 332-17, 332-18, 332-19, 332-20, 332-21, 332-22, 332-23, 332-24, and 332-25 can be used to define the neural network used during AI operations. Bits 334-0, 334-1, 334-2, 334-3, 334-4, 334-5, 334-6, and 334-7 of registers 332-13 and 332-14 can define the number of rows 381 in a matrix used in AI operations. Bits 334-0, 334-1, 334-2, 334-3, 334-4, 334-5, 334-6, and 334-7 of registers 332-15 and 332-16 can define the number of columns 382 in a matrix used in AI operations.

Bits 334-0, 334-1, 334-2, 334-3, 334-4, 334-5, 334-6, and 334-7 of registers 332-17 and 332-18 can define the size of the neurons 383 used in AI operations. The size of the neurons can indicate the width of the neurons in terms of number of bits and/or the type of input, such as floating point, integer, and/or double, among other types. Bits 334-0, 334-1, 334-2, 334-3, 334-4, 334-5, 334-6, and 334-7 of registers 332-19, 332-20, and 322-21 can indicate the number of neurons 384 of the neural network used in AI operations. Bits 334-4, 334-5, 334-6, and 334-7 of register 332-22 can indicate a start address 385 of the blocks in memory arrays of the neurons used in AI operations. Bits 334-0, 334-1, 334-2, and 334-3 of register 332-5 can indicate an end address 386 of the blocks in memory arrays of the neurons used in AI operations. If the start address 385 and the end address 386 is the same address, only one block of neurons is indicated for the AI operations. Bits 334-0, 334-1, 334-2, 334-3, 334-4, 334-5, 334-6, and 334-7 of registers 332-23, 332-24, and 322-25 can indicate the number of layers 387 of the neural network used in AI operations.

Register 332-26 can enable a debug/hold mode of the A accelerator and an output to be observed at a layer of AI operations. Bit 334-0 of register 332-26 can indicate that the AI accelerator is in a debug/hold mode and that an activation function should be applied 391 during AI operations. Bit 334-1 of register 332-26 can indicate that the AI operation can step forward 390 (e.g., perform a next step in an AI operation) in AI operations. The programming of bit 334-1 can be embedded in the execution of the AI operations. The AI operations can be stopped, results of the AI operations can be observed, errors can be corrected, and/or the register 332-26 can be reprogrammed to include another step and/or remove a step in the AI operations. In some examples, previous content at a particular step of the AI operations can restore temporary content to see an effect of a modification on the AI operations. Bit 334-2 and bit 334-3 of register 232-26 can indicate that the temporary blocks, where the output of the layer is located, is valid 388 and 389. The data in the temporary blocks can be changed by a host and/or a controller on the memory device, such that the changed data can be used in the AI operation as the AI operation steps forward.

Bits 334-0, 334-1, 334-2, 334-3, 334-4, 334-5, 334-6, and 334-7 of registers 332-27, 332-28, and 332-29 can define the layer where the debug/hold mode will stop 392 the AI operation and observe the output of the layer.

Registers 332-30, 332-31, 332-32, and 332-33 can define the size of temporary blocks used in AI operations and the start address and end address of the temporary blocks used in AI operations. Bits 334-4, 334-5, 334-6, and 334-7 of register 332-30 can define the start address 393 of a first temporary block used in AI operations. Bits 334-0, 334-1, 334-2, and 334-3 of register 332-30 can define the end address 394 of a first temporary block used in AI operations. Bits 334-0, 334-1, 334-2, 334-3, 334-4, 334-5, 334-6, and 334-7 of registers 332-31 and 332-32 can define the size 395 of the temporary blocks used in AI operations. The size of the temporary blocks can indicate the width of the temporary blocks in terms of number of bits and/or the type of input, such as floating point, integer, and/or double, among other types. Bits 334-4, 334-5, 334-6, and 334-7 of register 332-33 can define the start address 396 of a second temporary block used in AI operations. Bits 334-0, 334-1, 334-2, and 334-3 of register 332-34 can define the end address 397 of a second temporary block used in AI operations.

Registers 332-34, 332-35, 332-36, 332-37, 332-38, and 332-39 can be associated with the activation functions used in AI operations. Bit 334-0 of register 332-34 can enable usage of the activation function block 3101. Bit 334-1 of register 332-34 can enable holding that AI at a neuron 3100 and usage of the activation function for each neuron. Bit 334-2 of register 332-34 can enable holding the AI at a layer 399 and the usage of the activation function for each layer. Bit 334-3 of register 332-34 can enable usage of an external activation function 398.

Bits 334-4, 334-5, 334-6, and 334-7 of register 332-35 can define the start address 3102 of activation function blocks used in AI operations. Bits 334-0, 334-1, 334-2, and 334-3 of register 332-35 can define the end address 3103 of activation functions blocks used in AI operations. Bits 334-0, 334-1, 334-2, 334-3, 334-4, 334-5, 334-6, and 334-7 of registers 332-36 and 332-37 can define the resolution of the inputs (e.g., x-axis) 3104 of the activation functions. Bits 334-0, 334-1, 334-2, 334-3, 334-4, 334-5, 334-6, and 334-7 of registers 332-38 and 332-39 can define the resolution and/or the outputs (e.g., y-axis) 3105 of the activation functions for a given x-axis value of a custom activation function.

Registers 332-40, 332-41, 332-42, 332-43, and 332-44 can define the size of bias values used in AI operations, the number of bias values used in AI operations, and the start address and end address of the bias values used in AI operations. Bits 334-0, 334-1, 334-2, 334-3, 334-4, 334-5, 334-6, and 334-7 of registers 332-40 and 332-41 can define the size of the bias values 3106 used in AI operations. The size of the bias values can indicate the width of the bias values in terms of number of bits and/or the type of bias values, such as floating point, integer, and/or double, among other types. Bits 334-0, 334-1, 334-2, 334-3, 334-4, 334-5, 334-6, and 334-7 of registers 332-42 and 332-43 can indicate the number of bias values 3107 used in AI operations. Bits 334-4, 334-5, 334-6, and 334-7 of register 332-44 can indicate a start address 3108 of the blocks in memory arrays of the bias values used in AI operations. Bits 334-0, 334-1, 334-2, and 334-3 of register 332-44 can indicate an end address 3109 of the blocks in memory arrays of the bias values used in AI operations. If the start address 3108 and the end address 3109 is the same address, only one block of bias values is indicated for the AI operations.

Register 332-45 can provide status information for the AI calculations and provide information for the debug/hold mode. Bit 334-0 of register 332-45 can activate the debug/hold mode 3114. Bit 334-1 of register can indicate that the AI accelerator is busy 3113 and performing AI operations. Bit 334-2 of register 332-45 can indicate that the AI accelerator is on 3112 and/or that the full capability of the AI accelerator should be used. Bit 334-3 of register 332-45 can indicate only matrix calculations 3111 of the AI operations should be made. Bit. 334-4 of register 332-45 can indicate that the AI operation can step forward 3110 and proceed to the next neuron and/or layer.

Register 332-46 can provide error information regarding AI operations. The host can retrieve AI operation information when AI operations are being performed. Bit 334-3 of register 332-46 can indicate that there was an error in a sequence 3115 of an AI operation. Bit 334-2 of register 332-46 can indicate that there was an error in an algorithm 3116 of an AI operation. Bit 334-1 of register 332-46 can indicate there was an error in a page of data that ECC was not able to correct 3117. Bit 334-0 of register 332-46 can indicate there was an error in a page of data that ECC was able to correct 3118.

Register 332-47 can indicate an activation function to use in AI operations. In some examples, a controller can include a number of activation function registers including register 332-47 to define and use (e.g., start) activation functions in AI operations.

Bits 334-0, 334-1, 334-2, 334-3, 334-4, 334-5, and 334-6 of register 332-47 can indicate one of a number of pre-defined activation functions 3120 can be used in AI operations. The number of pre-defined activation functions can include an identity function (e.g., identity relation, identity map, and/or identity transformation), a binary step function, a logistic function (e.g., sigmoid function and/or a soft step function), a hyperbolic tangent function (e.g., tan H), an inverse tangent function (e.g., ArcTan), a softsign function, an inverse square root unit (ISRU) function, a rectified linear unit (ReLU) function, a leaky rectified linear unit (Leaky ReLU) function, a parametric rectified linear unit (PReLU) function, a randomized leaky rectified linear unit (RReLU) function, an exponential linear unit (ELU) function, and/or a scaled exponential linear unit (SELU) function, among other functions. In some examples, a pre-defined activation function can be executed in response to a result of an AI operation.

The controller can indicate and execute one of a number of pre-defined activation functions 3120 by programming a bit and/or bits of register 332-47 to particular states. For example, bit 334-0 of register 332-47 can be programmed to a first state to execute an identity function for AI operations and/or a second state to prevent and/or stop an execution of an identity function and bit 334-1 of register 332-47 can be programmed to a first state to execute a binary step function for AI operations and/or a second state to prevent and/or stop an execution of a binary step function.

Bit 334-7 of register 332-47 can indicate a custom activation function 3119 located in a block can be used in AI operations. The AI operations can include updating, changing, and/or creating custom activation functions. A custom activation function 3119 can be created based on a result of a previous AI operation. For example, a custom activation function 3119 can be based on a result of a debug operation.

The controller can indicate a custom activation function 3119 by programming a bit and/or bits of register 332-47 to particular states. For example, bit 334-7 of register 332-47 can be programmed to a first state to use a custom activation function 3119 in AI operations and/or a second state to prevent and/or stop use of a custom activation function.

Registers 332-48, 332-49, and 332-50 can indicate the neuron and/or layer where the AI operation is executing. Bits 334-0, 334-1, 334-2, 334-3, 334-4, 334-5, 334-6, and 334-7 of registers 332-48, 332-49, and 332-50 can indicate the address of the neuron and/or layer where the AI operation is executing. In the case where errors occur during the AI operations, registers 332-48, 332-49, and 332-50 can indicate the neuron and/or layer where an error occurred.

Figure 4:
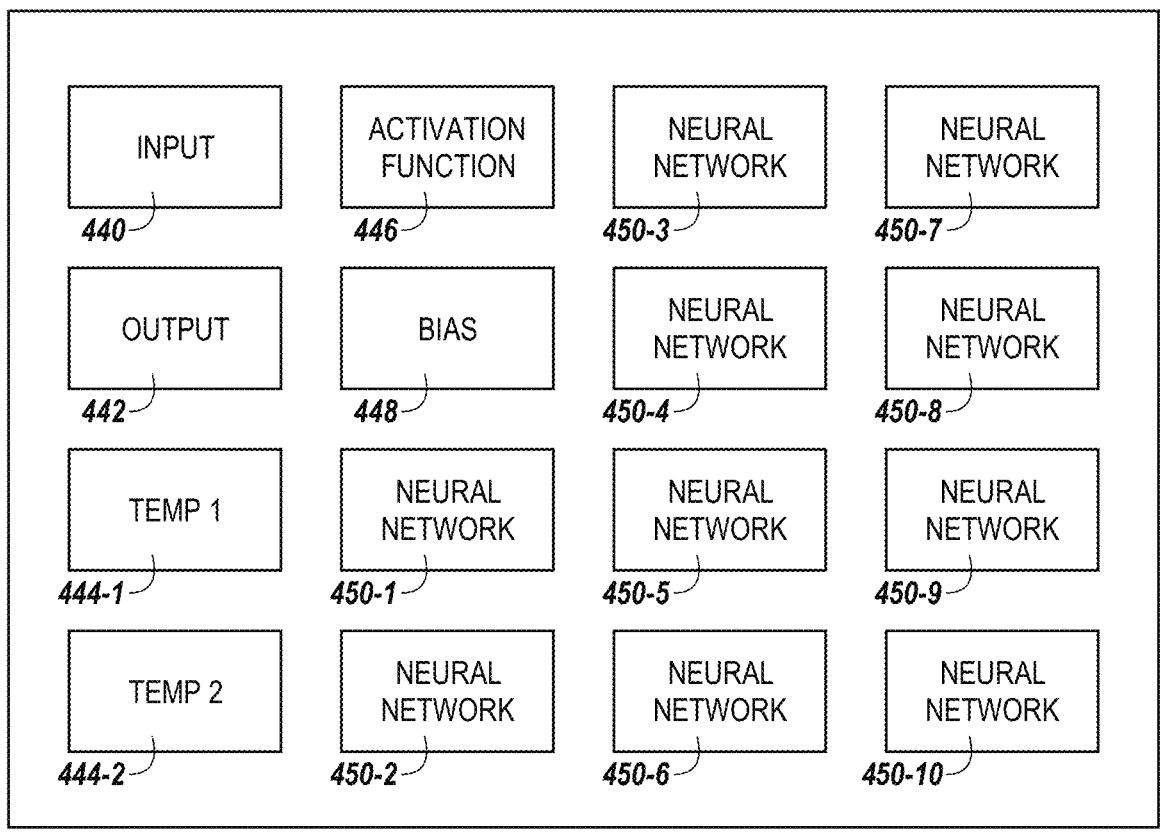
FIG. 4 is a block diagram of a number of blocks of a memory device with an artificial intelligence (AI) accelerator in accordance with a number of embodiments of the present disclosure

FIG. 4 is a block diagram of a number of blocks of a memory device with an artificial intelligence (AI) accelerator in accordance with a number of embodiments of the present disclosure. Input block 440 is a block in the memory arrays where input data is stored. Data in input block 440 can be used as the input for AI operations. The address of input block 440 can be indicated in register 5 (e.g. register 232-5 in FIGS. 2 and 332-5 in FIG. 3A). Embodiments are not limited to one input block as there can be a plurality of input blocks. Data input block 440 can be sent to the memory device from the host. The data can accompany a command indicated that AI operations should be performed on the memory device using the data.

Output block 420 is a block in the memory arrays where output data from AI operations is stored. Data in output block 442 can be used store the output from AI operations and sent to the host. The address of output block 442 can be indicated in register 11 (e.g. register 232-11 in FIGS. 2 and 332-11 in FIG. 3A). Embodiments are not limited to one output block as there can be a plurality of output blocks.

Data in output block 442 can be sent to host upon completion and/or holding of an AI operation. Temporary blocks 444-1 and 444-2 can be blocks in memory arrays where data is stored temporarily while AI operations are being performed. Although FIG. 4 includes two temporary blocks 444-1 and 444-2, the memory device can include one or more temporary blocks. Data can be stored in temporary blocks 444-1 and 444-2 while the AI operations are iterating through the neuron and layers of the neural network used for the AI operations. The address of temporary block 448 can be indicated in registers 30 and 33 (e.g. registers 232-30 and 232-33 in FIGS. 2 and 332-30 and 332-33 in FIG. 3B). Embodiments are not limited to two temporary blocks as there can be a plurality of temporary blocks.

Activation function block 446 can be a block in the memory array where the activation functions for the AI operations are stored and/or in the memory controller firmware. Activation function block 446 can store pre-defined activation functions and/or custom activation functions that are created by the host and/or A accelerator. The address of activation function block 448 can be indicated in register 35 (e.g. register 232-35 in FIGS. 2 and 332-35 in FIG. 3B). Embodiments are not limited to one activation function block as there can be a plurality of activation function blocks.

Bias values block 448 is a block in the memory array where the bias values for the AI operations are stored. The address of bias values block 448 can be indicated in register 44 (e.g. register 232-44 in FIGS. 2 and 332-44 in FIG. 3B). Embodiments are not limited to one bias value block as there can be a plurality of bias value blocks.

Neural network blocks 450-1, 450-2, 450-3, 450-4, 450-5, 450-6, 450-7, 450-8, 450-9, and 450-10 are a block in the memory array where the neural network for the AI operations are stored. Neural network blocks 450-1, 450-2, 450-3, 450-4, 450-5, 450-6, 450-7, 450-8, 450-9, and 450-10 can store the information for the neurons and layers that are used in the AI operations. The address of neural network blocks 450-1, 450-2, 450-3, 450-4, 450-5, 450-6, 450-7, 450-8, 450-9, and 450-10 can be indicated in register 22 (e.g. register 232-22 in FIGS. 2 and 332-22 in FIG. 3A).

Figure 5:
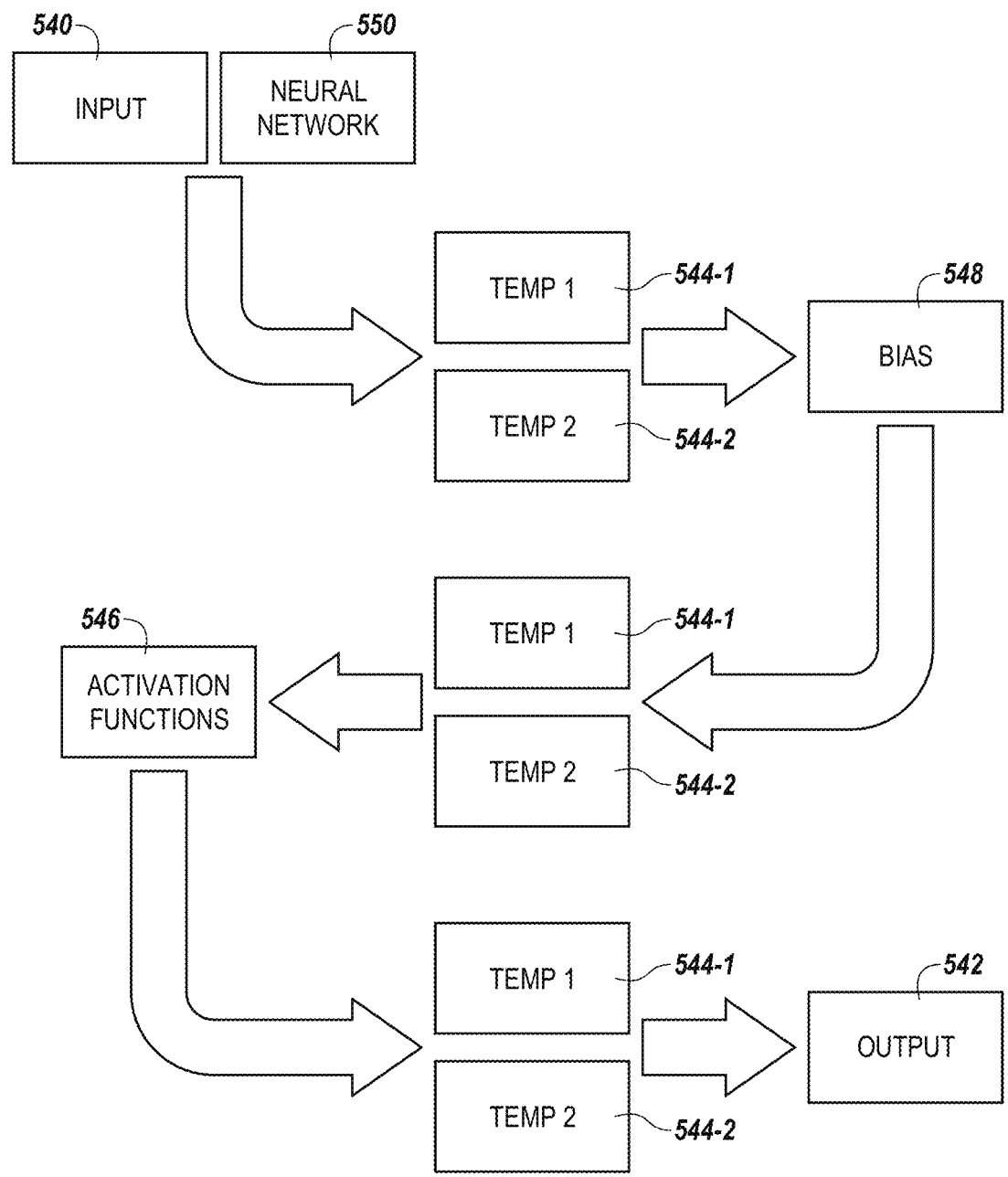
FIG. 5 is a flow diagram illustrating an example artificial intelligence process in a memory device with an artificial intelligence (AI) accelerator in accordance with a number of embodiments of the present disclosure.

FIG. 5 is a flow diagram illustrating an example artificial intelligence process in a memory device with an artificial intelligence (AI) accelerator in accordance with a number of embodiments of the present disclosure. In response to starting an AI operation, an AI accelerator can write input data 540 and neural network data 550 to the input and neural network block, respectively. The AI accelerator can perform AI operations using input data 540 and neural network data 550. The results can be stored in temporary blocks 544-1 and 544-2. The temporary blocks 554-1 and 544-2 can be used to store data while performing matrix calculations, adding bias data, and/or to applying activation functions during the AI operations.

An AI accelerator can receive the partial results of AI operations stored in temporary blocks 544-1 and 544-2 and bias value data 548 and perform AI operations using the partial results of AI operations bias value data 548. The results can be stored in temporary blocks 544-1 and 544-2.

An AI accelerator can receive the partial results of AI operations stored in temporary blocks 544-1 and 544-2 and activation function data 546 and perform AI operations using the partial results of AI operations and activation function data 546. The results can be stored in output blocks 542.

In a number of embodiments, the activation function data 546 can be a result of one or more of a number of activation functions for AI operations. The activation functions can be pre-defined activation functions or custom activation functions created as a result of a previous AI operation, as previously described in connection with FIG. 3B. The number of activation functions can include an identity function (e.g., identity relation, identity map, and/or identity transformation), a binary step function, a logistic function, a hyperbolic tangent function (e.g., tan H), an inverse tangent function (e.g., ArcTan), a softsign function, an inverse square root unit (ISRU) function, a rectified linear unit (ReLU) function, a leaky rectified linear unit (Leaky ReLU) function, a parametric rectified linear unit (PReLU) function, a randomized leaky rectified linear unit (RReLU) function, an exponential linear unit (ELU) function, and/or a scaled exponential linear unit (SELU) function.

FIG. 6 is a table 6123 illustrating a number of activation functions 6122-1, . . . , 6122-13 for artificial intelligence (AI) operations in accordance with a number of embodiments of the present disclosure. Table 6123 includes a name 6124, a graph 6125, an equation 6126, a derivative equation 6127, and an interval 6128 for each of the number of activation functions 6122-1, . . . , 6122-13. The number of activation functions 6122-1, . . . , 6122-13 can include an identity function (e.g., identity relation, identity map, and/or identity transformation), a binary step function, a logistic function, a hyperbolic tangent function (e.g., tan H), an inverse tangent function (e.g., ArcTan), a softsign function, an inverse square root unit (ISRU) function, a rectified linear unit (ReLU) function, a leaky rectified linear unit (Leaky ReLU) function, a parametric rectified linear unit (PReLU) function, a randomized leaky rectified linear unit (RReLU) function, an exponential linear unit (ELU) function, and/or a scaled exponential linear unit (SELU) function. In some examples, the logistic function can include a sigmoid function and/or a soft step function. The activation functions for AI operations may include, but are not limited to, the number of activation functions 6122-1, . . . , 6122-13 illustrated in table 6123.

The number of activation functions 6122-1, . . . , 6122-13 can be pre-defined activation functions and one or more bits in a register can indicate a pre-defined activation function to be used in AI operations, as previously discussed in connection with FIG. 3B. In some examples, the number of activation functions 6122-1, . . . , 6122-13 can be modified (e.g., changed) to a custom activation function. As discussed in connection with FIG. 3B, a custom activation function can be created based on a result of a previous AI operation. In some examples, a custom activation function can be based on a result of a previous AI operation and one or more of the number of activation functions 6122-1, . . . , 6122-13. An activation function can be selected among pre-defined and custom activation functions based on the result of the previous AI operation and a different activation function can be selected for each layer.

Figure 7A:
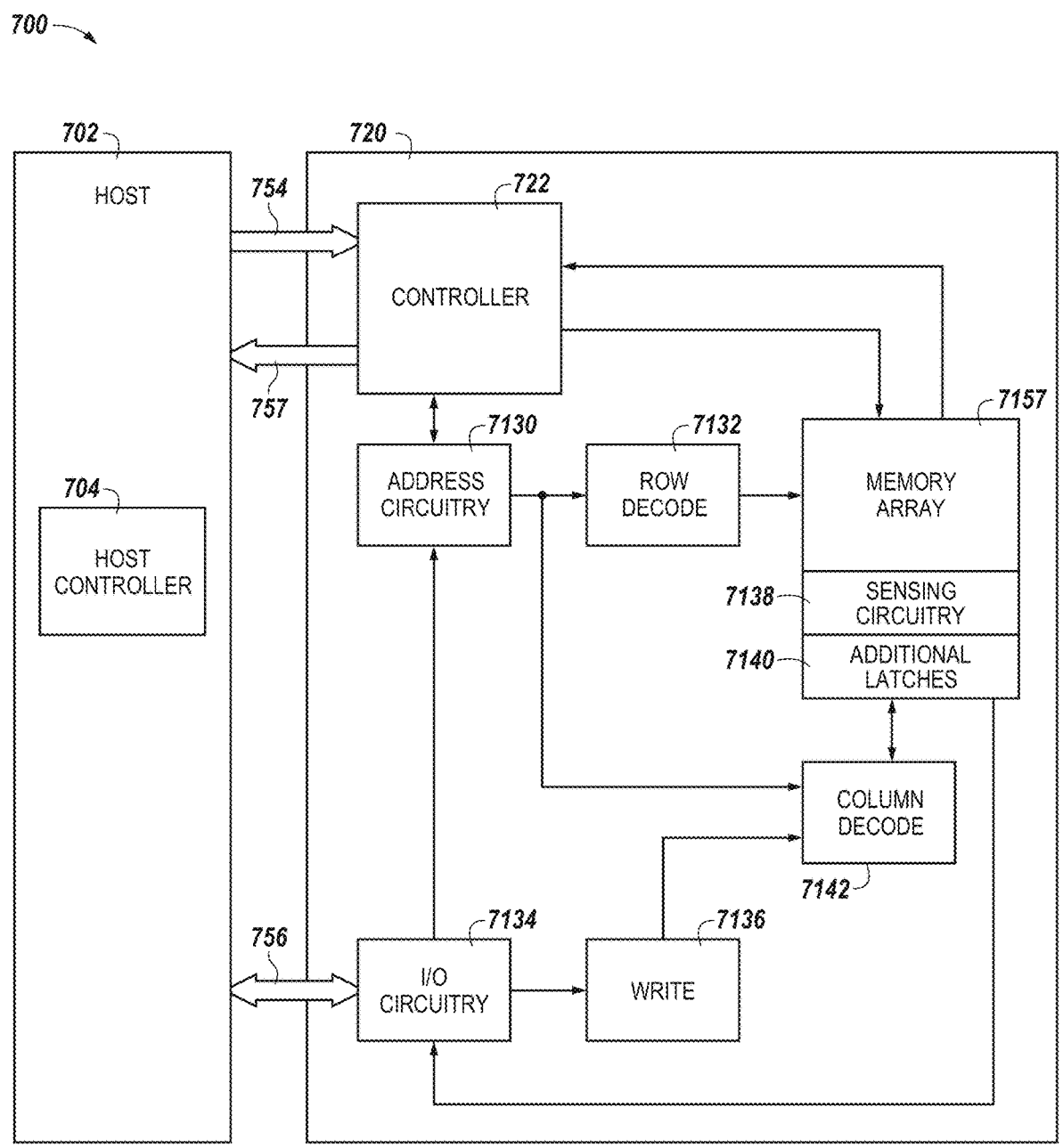
FIG. 7A is a block diagram of an apparatus in the form of a computing system including a memory device with an artificial intelligence (AI) accelerator in accordance with a number of embodiments of the present disclosure.

FIG. 7A is a block diagram of an apparatus in the form of a computing system 700 including a memory device 720 with an artificial intelligence (AI) accelerator, which includes a memory array 725 in accordance with a number of embodiments of the present disclosure. As used herein, a memory device 720, controller 740, memory array 725, sensing circuitry 7138, and/or a number of additional latches 7140 might also be separately considered an "apparatus."

In FIG. 7A, the AI accelerator (e.g., AI accelerator 124 in FIG. 1) can include sensing circuitry 7138 and additional latches 7140, among other components described in association with FIGS. 7A-10B, that are configured to perform operations, such as logic operations, associated with AI operations. As described below in associated with FIGS. 7A-10B, memory devices (e.g., memory device 720) can be configured to perform operations associated with AI operations as part of the A accelerator.

Figure 7B:
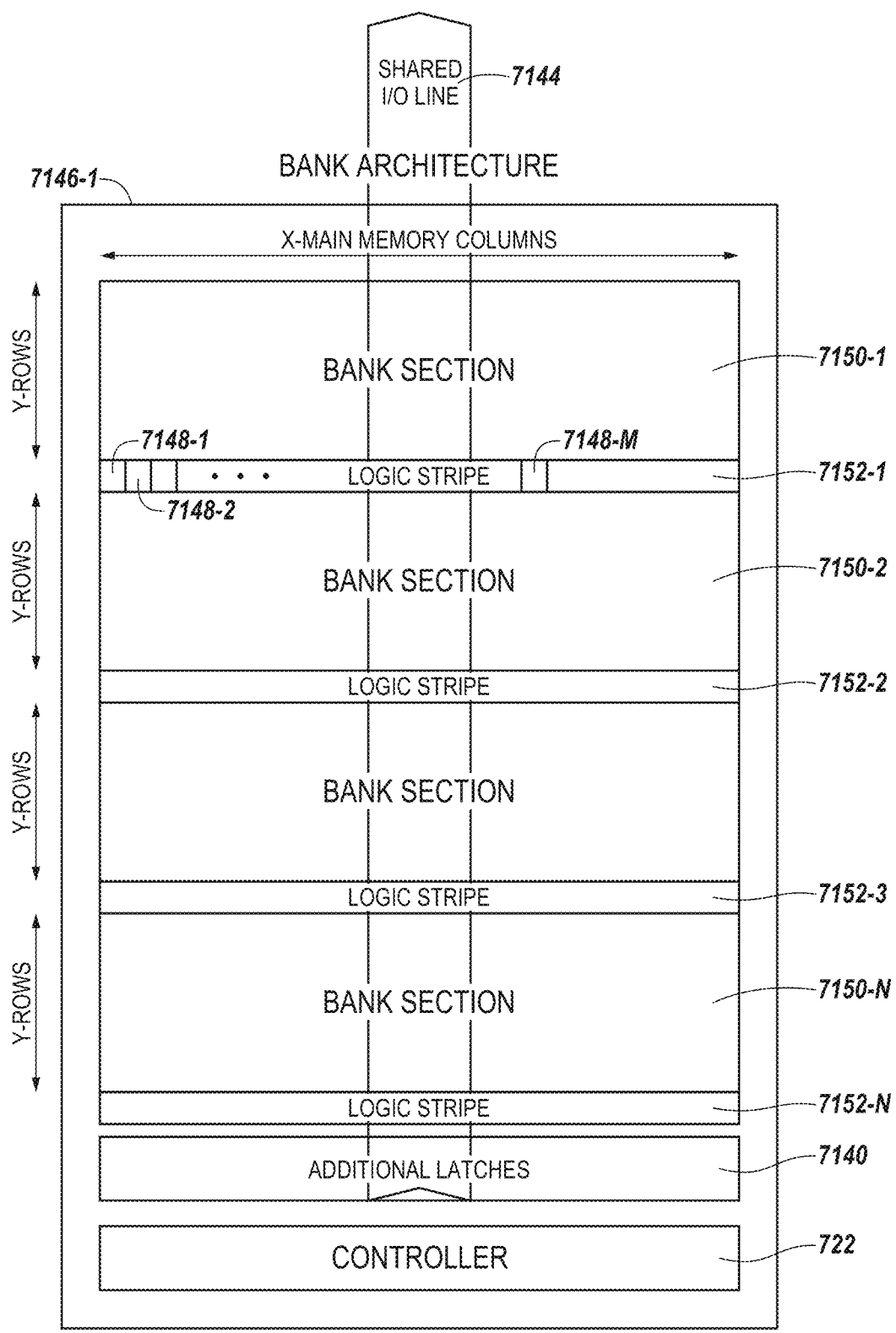
FIG. 7B is block diagram of an apparatus in the form of a computing system including a memory device having a shared input/out (I/O) line in a data path local to bank sections of an array with an artificial intelligence (AI) accelerator in accordance with a number of embodiments of the present disclosure.

As used herein, the additional latches are intended to mean additional functionalities (e.g., amplifiers, select logic) that sense, couple, and/or move (e.g., read, store, cache) data values of memory cells in an array and that are distinct from the plurality of compute components 7148-1, . . . , 7148-M and/or logic stripes 7152-1, . . . , 7152-N in a compute unit in a data path of the plurality of shared I/O lines 7144 shown in FIGS. 7B, 8, 9, 10A and 10B. The logic stripes 7152-1, . . . , 7152-N in a data path of a plurality of shared input/output (I/O) lines 7144 local to the array, as shown in FIGS. 7A and 7B, may be associated with various bank sections 7150-1, . . . , 7150-N of memory cells in the bank 7146-1. The bank 7146-1 may be one of a plurality of banks on the memory device 720.

System 700 in FIG. 7A includes a host 702 coupled (e.g., connected) to the memory device 720. Host 702 can be a host system such as a personal laptop computer, a desktop computer, a digital camera, a smart phone, or a memory card reader, among various other types of hosts. Host 702 can include a system motherboard and/or backplane and can include a number of processing resources (e.g., one or more processors, microprocessors, or some other type of controlling circuitry). The system 700 can include separate integrated circuits or both the host 702 and the memory device 720 can be on the same integrated circuit. The system 700 can be, for instance, a server system and/or a high performance computing (HPC) system and/or a portion thereof. Although the examples shown in FIG. 7A illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 700 has been simplified to focus on features with particular relevance to the present disclosure. The memory array 725 can be a DRAM array, SRAM array, STT RAM array, PCRAM array, TRAM array, RRAM array, NAND flash array, and/or NOR flash array, among other types of arrays. The array 725 can include memory cells arranged in rows coupled by access lines (which may be referred to herein as word lines or select lines) and columns coupled by sense lines (which may be referred to herein as data lines or digit lines). Although a single array 725 is shown in FIG. 7A, embodiments are not so limited. For instance, memory device 720 may include a number of arrays 725 (e.g., a number of banks of DRAM cells, NAND flash cells, etc.).

The memory device 720 can include address circuitry 7525 to latch address signals provided over a data bus 756 (e.g., an I/O bus connected to the host 702) by I/O circuitry 7134 (e.g., provided to external ALU circuitry and/or to DRAM DQs via local I/O lines and global I/O lines). As used herein, DRAM DQs can enable input of data to and/or output of data from a bank (e.g., from and/or to the controller 740 and/or host 702) via a bus (e.g., data bus 756). During a write operation, a voltage (high=1, low=0) can be applied to a DQ (e.g., a pin). This voltage can be translated into an appropriate signal and stored in a selected memory cell. During a read operation, a data value read from a selected memory cell can appear at the DQ once access is complete and the output is enabled (e.g., by the output enable signal being low). At other times, DQs can be in a high impedance state, such that the DQs do not source or sink current and do not present a signal to the system. This also may reduce DQ contention when two or more devices (e.g., banks) share a combined data bus, as described herein. Such DQs are separate and distinct from the plurality of shared I/O lines 7144 (in FIG. 7B) in a data path local to the array 725.

Status and exception information can be provided from the controller 740 of the memory device 720 to a channel controller 704, for example, through an out-of-band (OOB) bus 757, e.g., high-speed interface (HSI), which in turn can be provided from the channel controller 704 to the host 702. The channel controller 704 can include a logic component to allocate a plurality of locations (e.g., controllers for subarrays) in the arrays of each respective bank to store bank commands, application instructions (e.g., for sequences of operations), and arguments (PIM commands) for various banks associated with operations for each of a plurality of memory devices 720. The channel controller 704 can dispatch commands (e.g., PIM commands) to the plurality of memory devices 720 to store those program instructions within a given bank 7146 (FIG. 7B) of a memory device 720.

Address signals are received through address circuitry 7525 and decoded by a row decoder 7132 and a column decoder 7142 to access the memory array 725. Data can be sensed (read) from memory array 725 by sensing voltage and/or current changes on sense lines (digit lines) using a number of sense amplifiers, as described herein, of the sensing circuitry 7138. A sense amplifier can read and latch a page (e.g., a row) of data from the memory array 725. Additional compute circuitry, as described herein, can be coupled to the sensing circuitry 7138 and can be used in combination with the sense amplifiers to sense, store (e.g., cache and/or buffer), perform compute functions (e.g., operations), and/or move data. The I/O circuitry 7134 can be used for bi-directional data communication with host 702 over the data bus 756 (e.g., a 64 bit wide data bus). The write circuitry 7136 can be used to write data to the memory array 725.

Controller 740 (e.g., bank control logic, sequencer and timing circuitry shown in FIG. 7A) can decode signals (e.g., commands) provided by control bus 754 from the host 702. These signals can include chip enable signals, write enable signals, and/or address latch signals that can be used to control operations performed on the memory array 725, including data sense, data store, data movement (e.g., copying, transferring, and/or transporting data values), data write, and/or data erase operations, among other operations. In various embodiments, the controller 740 can be responsible for executing instructions from the host 702 and accessing the memory array 725. The controller 740 can be a state machine, a sequencer, or some other type of controller. The controller 740 can control shifting data (e.g., right or left) in a row of an array (e.g., memory array 725) and execute microcode instructions to perform operations such as compute operations, e.g., AND, OR, NOR, XOR, add, subtract, multiply, divide, etc.

Examples of the sensing circuitry 7138 are described further below (e.g., in FIGS. 7-8B). For instance, in some embodiments, the sensing circuitry 7138 can include a number of sense amplifiers and a number of compute components, which may serve as an accumulator and can be used to perform operations in each subarray (e.g., on data associated with complementary sense lines).

In some embodiments, the sensing circuitry 7138 can be used to perform operations using data stored in memory array 725 as inputs and participate in movement of the data for copy, transfer, transport, writing, logic, and/or storage operations to a different location in the memory array 725 without transferring the data via a sense line address access (e.g., without firing a column decode signal). As such, various compute functions can be performed using, and within, sensing circuitry 7138 rather than (or in association with) being performed by processing resources external to the sensing circuitry 7138 (e.g., by a processor associated with host 702 and/or other processing circuitry, such as ALU circuitry, located on device 720, such as on controller 740 or elsewhere). However, in addition, embodiments according to the present disclosure perform compute functions on data values moved to a plurality of compute components 7148-1, . . . , 7148-M and/or logic stripes 7152-1, . . . , 7152-N in a compute unit from the rows of the array. And as an example, according to embodiments, compute operations may be controlled in the compute unit at speeds of 2 nanoseconds (ns) without having to move the data values back into the rows, as compared to an example time required to fire the rows in the array of 60 nanoseconds (ns).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O circuitry 7134.

In contrast, embodiments according to the present disclosure perform compute functions on data values, moved to a plurality of compute components 7148-1, . . . , 7148-M and/or logic stripes 7152-1, . . . , 7152-N via a plurality of shared I/O lines 7144 from the rows of the array, in a compute unit in a data path local to the array. Additionally, sensing circuitry 7138 may be configured to perform operations on data stored in memory array 725 and store the result back to the memory array 725 without enabling an I/O line (e.g., a local I/O line) coupled to the sensing circuitry 7138. However, once loaded, compute operations may be controlled in the compute unit much faster, e.g., at speeds of 2 nanoseconds (ns), without having to move the data values back into the rows, as compared to an example time required to fire the rows in the array, e.g., 60 nanoseconds (ns). The sensing circuitry 7138 can be formed on pitch with the memory cells of the array. The plurality of compute components 7148-1, . . . , 7148-M and/or logic stripes 7152-1, . . . , 7152-N, associated with the data path of the plurality of shared I/O lines 7144, have a pitch equal to that of the data path and that is a function of a pitch of digit lines to the array of memory cells. For example, the compute component has a pitch that is an integer multiple of the pitch of digit lines to the array of memory cells.

For example, the sensing circuitry 7138 described herein can be formed on a same pitch as a pair of complementary sense lines (e.g., digit lines). As an example, a pair of complementary memory cells may have a cell size with a $6F^2$ pitch (e.g., $3F \times 2F$), where F is a feature size. If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines. Likewise, the compute components 7148-1, . . . , 7148-M and/or logic stripes 7152-1, . . . , 7152-N, associated with the data path of the plurality of shared I/O lines 7144, have a pitch that is a function of the 3F pitch of the complementary sense lines. For example, the compute components 7148-1, . . . , 7148-M and/or logic stripes 7152-1, . . . , 7152-N will have a pitch that is an integer multiple of the 3F pitch of digit lines to the array of memory cells.

By contrast, the circuitry of the processing resource(s) (e.g., a compute engine, such as an ALU) of various prior systems may not conform to pitch rules associated with a memory array. For example, the memory cells of a memory array may have a $4F^2$ or $6F^2$ cell size. As such, the devices (e.g., logic gates) associated with ALU circuitry of previous systems may not be capable of being formed on pitch with the memory cells (e.g., on a same pitch as the sense lines), which can affect chip size and/or memory density, for example. In the context of some computing systems and subsystems (e.g., a central processing unit (CPU)), data may be processed in a location that is not on pitch and/or on chip with memory (e.g., memory cells in the array), as described herein. For example, the data may be processed by a processing resource associated with a host, for instance, rather than on pitch with the memory.

As such, in a number of embodiments, circuitry external to array 725 and sensing circuitry 7138 is not needed to perform compute functions as the sensing circuitry 7138 can perform the appropriate operations to perform such compute functions or can perform such operations in a data path of a plurality of shared I/O lines local to the array without the use of an external processing resource. Therefore, the sensing circuitry 7138 and/or the plurality of compute components 7148-1, . . . , 7148-M and/or logic stripes 7152-1, . . . , 7152-N in a compute unit in a data path of the plurality of shared I/O lines 7144 may be used to complement or to replace, at least to some extent, such an external processing resource (or at least the bandwidth consumption of such an external processing resource). In some embodiments, the sensing circuitry 7138 and/or the plurality of compute components 7148-1, . . . , 7148-M and/or logic stripes 7152-1, . . . , 7152-N in a compute unit in a data path of the plurality of shared I/O lines 7144 may be used to perform operations (e.g., to execute instructions) in addition to operations performed by an external processing resource (e.g., host 702). For instance, host 702 and/or sensing circuitry 7138 may be limited to performing only certain operations and/or a certain number of operations.

Operations described herein can include operations associated with a processing in memory (PIM) capable device. PIM capable device operations can use bit vector based operations. As used herein, the term "bit vector" is intended to mean a physically contiguous number of bits on a bit vector memory device (e.g., a PIM device) stored physically contiguous in a row of an array of memory cells. Thus, as used herein a "bit vector operation" is intended to mean an operation that is performed on a bit vector that is a contiguous portion of virtual address space (e.g., used by a PIM device). For example, a row of virtual address space in the PIM device may have a bit length of 16K bits (e.g., corresponding to 16K complementary pairs of memory cells in a DRAM configuration). Sensing circuitry 7138, as described herein, for such a 16K bit row may include a corresponding 16K processing elements (e.g., compute components, as described herein) formed on pitch with the sense lines selectably coupled to corresponding memory cells in the 16 bit row. A compute component in the PIM device may operate as a one bit processing element (PE) on a single bit of the bit vector of the row of memory cells sensed by the sensing circuitry 7138 (e.g., sensed by and/or stored in a sense amplifier paired with the compute component, as described herein). Similarly, the plurality of compute components 7148-1, . . . , 7148-M and/or logic stripes 7152-1, . . . , 7152-N in a compute unit in a data path of the plurality of shared I/O lines 7144 may operate as a one bit processing element (PE) on a single bit of the bit vector of the row of memory cells sensed in an array.

Enabling an I/O line can include enabling (e.g., turning on, activating) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 7138) can be used to perform operations without enabling column decode lines of the array.

However, the plurality of shared/O lines 7144 may be enabled in order to load data values to the plurality of compute components 7148-1, . . . , 7148-M and/or logic stripes 7152-1, . . . , 7152-N in a compute unit in a data path of the plurality of shared I/O lines 7144 where compute operations may be controlled much faster. For example, in the plurality of compute components 7148-1, . . . , 7148-M and/or logic stripes 7152-1, . . . , 7152-N in the compute unit, the compute operation may be performed at speeds of 2 nanoseconds (ns). This enhancement of speed can be attributed to not having to move the data values back into the rows with the associated time used in firing the rows in the array, e.g., 60 nanoseconds (ns).

FIG. 7B is block diagram of an apparatus in the form of a computing system including a memory device having a shared input/out (I/O) line in a data path local to bank sections of an array with an artificial intelligence (AI) accelerator in accordance with a number of embodiments of the present disclosure. For example, bank 7146-1 can represent an example bank of a memory device 720. As shown in FIG. 7B, a bank 7146-1 can include a plurality of main memory columns (shown horizontally as X) (e.g., 16,384 columns in an example DRAM bank). Additionally, the bank 7146-1 may be divided up into bank sections (e.g., quadrants of 32 subarrays), 7150-1, 7150-2, . . . , 7150-N. Each bank section may be associated with a plurality of compute components 7148-1, . . . , 7148-M in logic stripes 7152-1, . . . , 7152-N in a compute unit in a data path of the plurality of shared I/O lines 7144. Each of the of the bank sections 7150-1, . . . , 7150-N can include a plurality of rows (shown vertically as Y) (e.g., each section may be a quadrant that includes 32 subarrays that each may include 512 rows in an example DRAM bank). Example embodiments are not limited to the example horizontal and/or vertical orientation of columns and rows described here or the example numbers thereof.

As shown in FIG. 7B, the bank 7146-1 can be divided into a plurality of bank sections 7150-1, . . . , 7150-N. Each bank sections can have a plurality of compute components 7148-1, . . . , 7148-M and logic stripes 7152-1, . . . , 7152-N in a compute unit in a data path of the plurality of shared I/O lines 7144 associated therewith. The bank 7146-1 can include a controller 740 to direct operations on data values loaded to the plurality of compute components 7148-1, ..., 7148-M in logic stripes 7152-1, ..., 7152-N in a compute unit in a data path of the plurality of shared I/O lines 7144.

Figure 8:
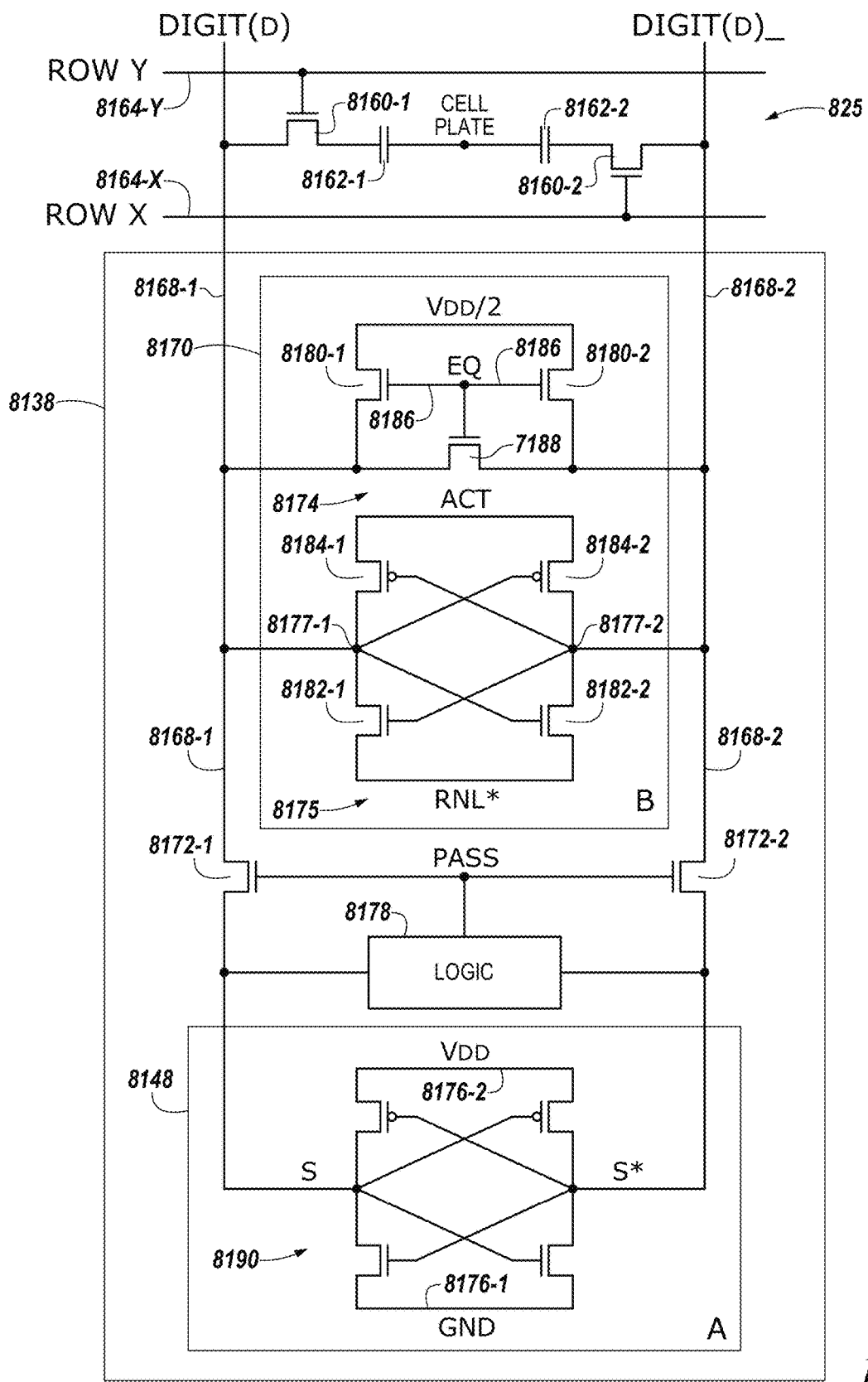
FIG. 8 is a schematic diagram illustrating sensing circuitry of a memory device, the sensing circuitry including a compute component, in accordance with a number of embodiments of the present disclosure.

FIG. 8 is a schematic diagram illustrating sensing circuitry 8138 in accordance with a number of embodiments of the present disclosure. The sensing circuitry 8138 can correspond to sensing circuitry 7138 shown in FIG. 7A.

As shown in the example embodiment of FIG. 8, a memory cell can include a storage element (e.g., capacitor) and an access device (e.g., transistor). For example, a first memory cell can include transistor 8160-1 and capacitor 8162-1, and a second memory cell can include transistor 8160-2 and capacitor 8162-2, etc. In this embodiment, the memory array 825 is a DRAM array of 1T1B (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

The cells of the memory array 825 can be arranged in rows coupled by access (word) lines 8164-X (Row X), 8164-Y (Row Y), etc., and columns coupled by pairs of complementary sense lines (e.g., digit lines DIGIT(D) and DIGIT(D)_shown in FIG. 8). The individual sense lines corresponding to each pair of complementary sense lines can also be referred to as digit lines 8168-1 for DIGIT (D) and 7168-2 for DIGIT (D)_, respectively, or corresponding reference numbers in FIGS. 9 and 10A-10B. Although only one pair of complementary digit lines are shown in FIG. 8, embodiments of the present disclosure are not so limited, and an array of memory cells can include additional columns of memory cells and digit lines (e.g., 4,096, 8,192, 16,384, etc.).

Although rows and columns are illustrated as orthogonally oriented in a plane, embodiments are not so limited. For example, the rows and columns may be oriented relative to each other in any feasible three-dimensional configuration. For example, the rows and columns may be oriented at any angle relative to each other, may be oriented in a substantially horizontal plane or a substantially vertical plane, and/or may be oriented in a folded topology, among other possible three-dimensional configurations.

Memory cells can be coupled to different digit lines and word lines. For example, a first source/drain region of a transistor 8160-1 can be coupled to digit line 8168-1 (D), a second source/drain region of transistor 8160-1 can be coupled to capacitor 8162-1, and a gate of a transistor 8160-1 can be coupled to word line 8164-Y. A first source/drain region of a transistor 8160-2 can be coupled to digit line 8168-2 (D)_, a second source/drain region of transistor 8160-2 can be coupled to capacitor 8162-2, and a gate of a transistor 8160-2 can be coupled to word line 8164-X. A cell plate, as shown in FIG. 8, can be coupled to each of capacitors 8162-1 and 8162-2. The cell plate can be a common node to which a reference voltage (e.g., ground) can be applied in various memory array configurations.

The memory array 825 is configured to couple to sensing circuitry 8138 in accordance with a number of embodiments of the present disclosure. In this embodiment, the sensing circuitry 8138 comprises a sense amplifier 8170 and a compute component 8148 corresponding to respective columns of memory cells (e.g., coupled to respective pairs of complementary digit lines). The sense amplifier 8170 can be coupled to the pair of complementary digit lines 8168-1 and 8168-2. The compute component 8148 can be coupled to the sense amplifier 8170 via pass gates 8172-1 and 8172-2. The gates of the pass gates 8172-1 and 8172-2 can be coupled to operation selection logic 8178.

The operation selection logic 8178 can be configured to include pass gate logic for controlling pass gates that couple the pair of complementary digit lines un-transposed between the sense amplifier 8170 and the compute component 8148 and swap gate logic for controlling swap gates that couple the pair of complementary digit lines transposed between the sense amplifier 8170 and the compute component 8148. The operation selection logic 8178 can also be coupled to the pair of complementary digit lines 8168-1 and 8168-2. The operation selection logic 8178 can be configured to control continuity of pass gates 8172-1 and 8172-2 based on a selected operation.

The sense amplifier 8170 can be operated to determine a data value (e.g., logic state) stored in a selected memory cell. The sense amplifier 8170 can comprise a cross coupled latch, which can be referred to herein as a primary latch. In the example illustrated in FIG. 8, the circuitry corresponding to sense amplifier 8170 comprises a latch 8175 including four transistors coupled to a pair of complementary digit lines D 6168-1 and (D) 8168-2. However, embodiments are not limited to this example. The latch 8175 can be a cross coupled latch (e.g., gates of a pair of transistors) such as n-channel transistors (e.g., NMOS transistors) 8182-1 and 8182-2 are cross coupled with the gates of another pair of transistors, such as p-channel transistors (e.g., PMOS transistors) 8184-1 and 8184-2). The cross coupled latch 8175 comprising transistors 8182-1, 8182-2, 8184-1, and 8184-2 can be referred to as the primary latch.

In operation, when a memory cell is being sensed (e.g., read), the voltage on one of the digit lines 8168-1 (D) or 8168-2 (D)_will be slightly greater than the voltage on the other one of digit lines 8168-1 (D) or 8168-2 (D)_. An ACT signal and an RNL* signal can be driven low to enable (e.g., fire) the sense amplifier 8170. The digit lines 8168-1 (D) or 8168-2 (D)_having the lower voltage will turn on one of the PMOS transistor 8184-1 or 8184-2 to a greater extent than the other of PMOS transistor 8184-1 or 8184-2, thereby driving high the digit line 8168-1 (D) or 8168-2 (D)_having the higher voltage to a greater extent than the other digit line 8168-1 (D) or 8168-2 (D) is driven high.

Similarly, the digit line 8168-1 (D) or 8168-2 (D)_having the higher voltage will turn on one of the NMOS transistor 8182-1 or 8182-2 to a greater extent than the other of the NMOS transistor 8182-1 or 8182-2, thereby driving low the digit line 8168-1 (D) or 8168-2 (D)_having the lower voltage to a greater extent than the other digit line 8168-1 (D) or 8168-2 (D)_is driven low. As a result, after a short delay, the digit line 8168-1 (D) or 8168-2 (D)_having the slightly greater voltage is driven to the voltage of the supply voltage $V_{CC}$ through a source transistor, and the other digit line 8168-1 (D) or 8168-2 (D)_is driven to the voltage of the reference voltage (e.g., ground) through a sink transistor. Therefore, the cross coupled NMOS transistors 8182-1 and 8182-2 and PMOS transistors 8184-1 and 8184-2 serve as a sense amplifier pair, which amplify the differential voltage on the digit lines 8168-1 (D) and 8168-2 (D)_and operate to latch a data value sensed from the selected memory cell on nodes 8177-1 and/or 8177-2.

Embodiments are not limited to the sense amplifier 8170 configuration illustrated in FIG. 8. As an example, the sense amplifier 8170 can be a current-mode sense amplifier and a single-ended sense amplifier (e.g., sense amplifier coupled to one digit line). Also, embodiments of the present disclosure are not limited to a folded digit line architecture such as that shown in FIG. 8.

The sense amplifier 8170 can, in conjunction with the compute component 8148, be operated to perform various operations using data from an array as input. In a number of embodiments, the result of an operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing operations and compute functions associated therewith using less power than various previous approaches. Additionally, since a number of embodiments eliminate the need to transfer data across local and global I/O lines in order to perform compute functions (e.g., between memory and discrete processor), a number of embodiments can enable an increased (e.g., faster) processing capability as compared to previous approaches.

The sense amplifier 8170 can further include equilibration circuitry 8174, which can be configured to equilibrate the digit lines 8168-1 (D) and 8168-2 (D)_. In this example, the equilibration circuitry 7174 comprises a transistor 8188 coupled between digit lines 8168-1 (D) and 8168-2 (D)_. The equilibration circuitry 8174 also comprises transistors 8180-1 and 8180-2 each having a first source/drain region coupled to an equilibration voltage (e.g., $V_{DD}/2$), where $V_{DD}$ is a supply voltage associated with the array. A second source/drain region of transistor 8180-1 can be coupled digit line 8168-1 (D), and a second source/drain region of transistor 8180-2 can be coupled digit line 8168-2 (D)_. Gates of transistors 8188, 8180-1, and 8180-2 can be coupled together, and to an equilibration (EQ) control signal line 8186. As such, activating EQ enables the transistors 8188, 8180-1, and 8180-2, which effectively shorts digit lines 8168-1 (D) and 8168-2 (D)_together and to the equilibration voltage (e.g., $V_{CC}/2$).

Although FIG. 8 shows sense amplifier 8170 comprising the equilibration circuitry 8174, embodiments are not so limited, and the equilibration circuitry 8174 may be implemented discretely from the sense amplifier 8170, implemented in a different configuration than that shown in FIG. 8, or not implemented at all.

As described further below, in a number of embodiments, the sensing circuitry 8138 (e.g., sense amplifier 8170 and compute component 8148) can be operated to perform a selected operation and initially store the result in one of the sense amplifier 8170 or the compute component 8148 without transferring data from the sensing circuitry via a local or global I/O line (e.g., without performing a sense line address access via activation of a column decode signal, for instance).

Figure 10A:
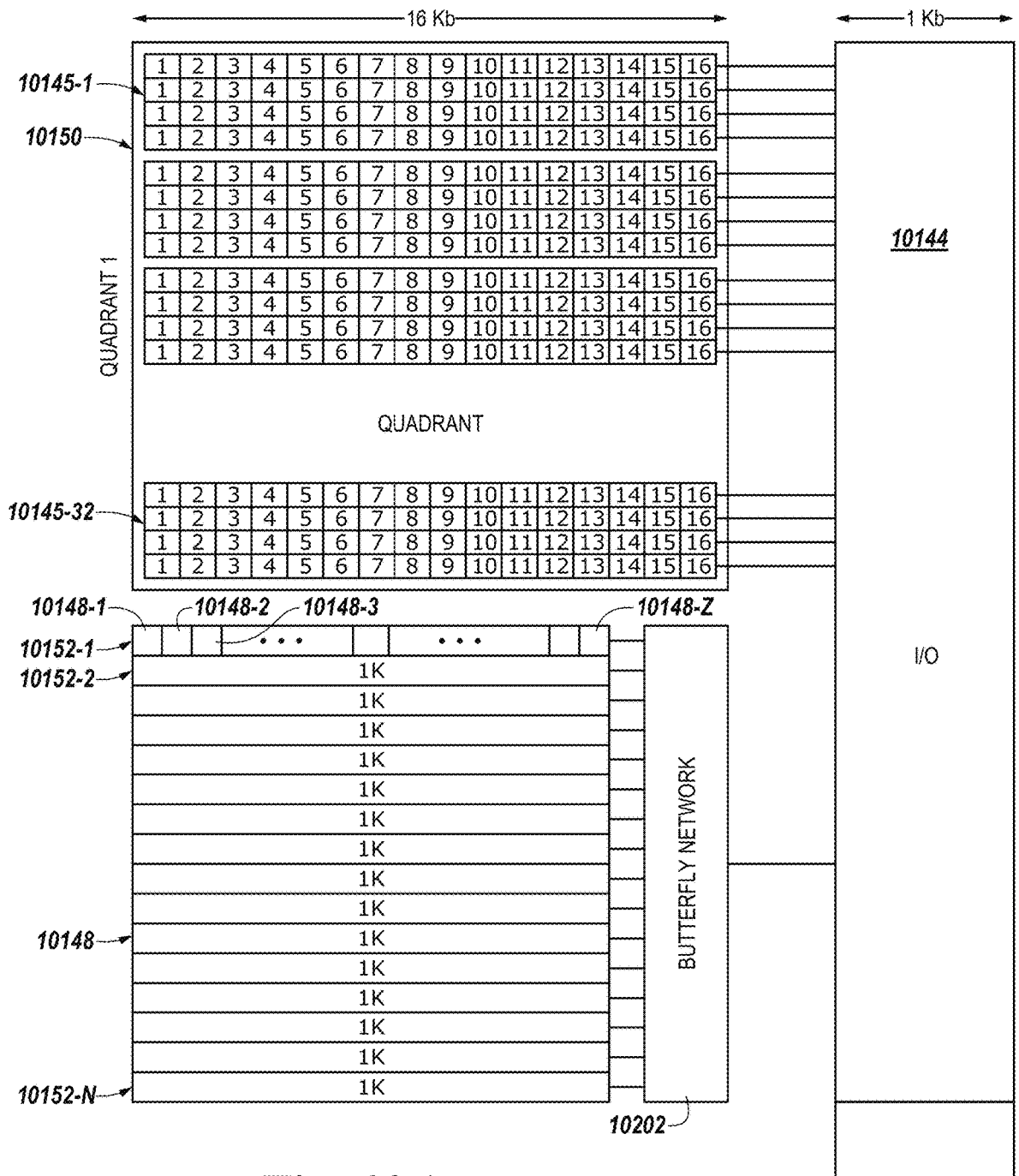
FIG. 10A is a block diagram example illustrating a plurality of sections of an array coupled to a compute unit, having a plurality of logic stripes, by a plurality of shared I/O lines in a data path local to the array.
Figure 10B:
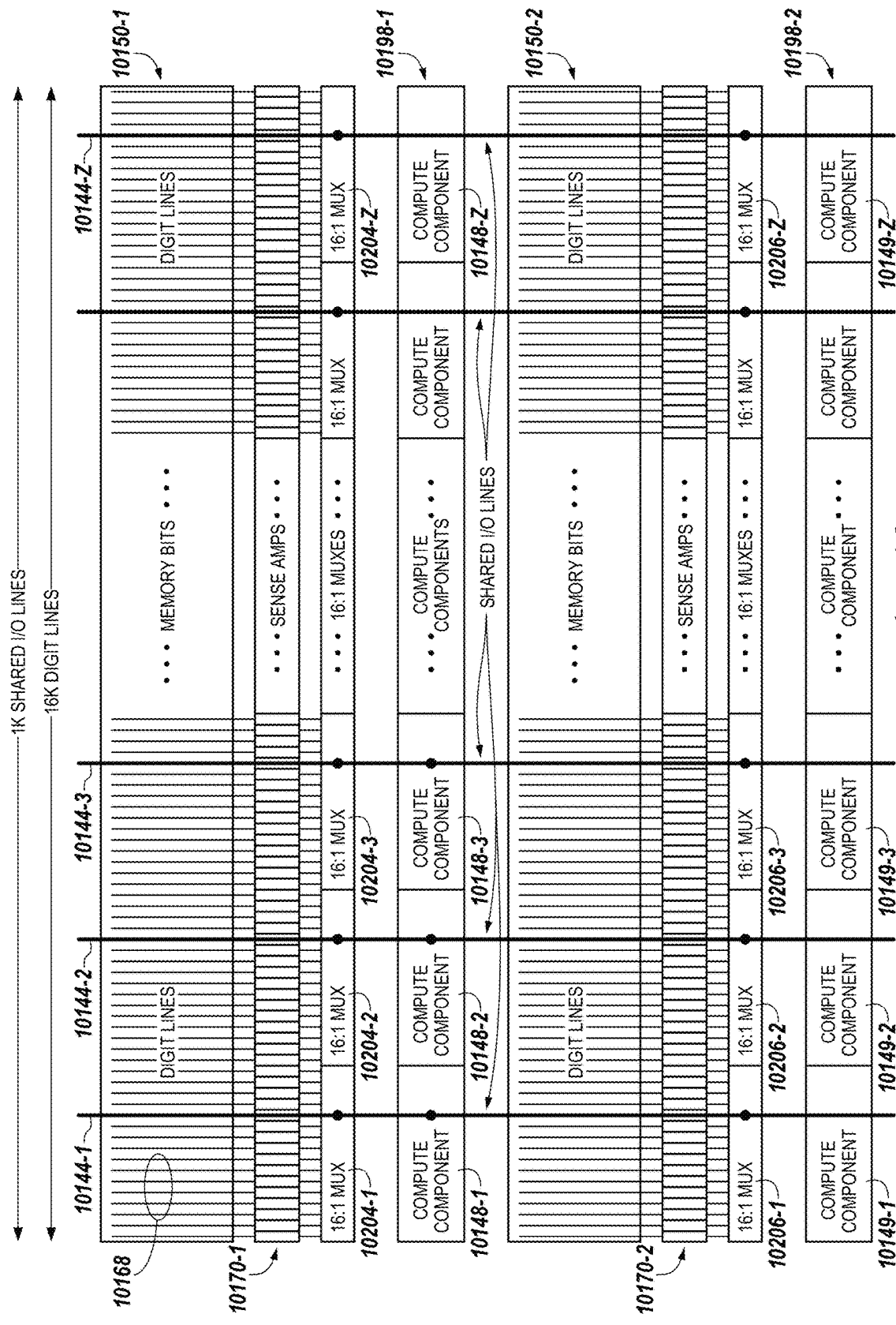
FIG. 10B is a block diagram example illustrating a plurality of arrays coupled to a plurality of compute components in a compute unit by a plurality of shared I/O lines in a data path local to the arrays where the compute component has a pitch equal to that of the data path of a shared I/O line and which is a multiple of a pitch of the digit lines to the array.

However, further to embodiments described herein, sensing circuitry 8138 having sense amplifiers, and which in some embodiments may also include compute components as shown in FIG. 8, can also couple the memory cells from a multiplexed column of memory cells in an array to the compute components 9148-1, . . . , 9148-M and/or logic stripes 9152-1, . . . , 9152-N in a compute unit 9198 in the data path of the plurality of shared I/O lines 9144 local to the array as discussed in connection with FIGS. 10A and 10B. In this manner, the compute components 10148-1, . . . , 10148-M and/or logic stripes 10152-1, . . . , 10152-N may be indirectly coupled to the memory cells of a column through the plurality of shared I/O lines 10144 via select logic (discussed in connection with FIGS. 10A and 10B).

Performance of operations (e.g., Boolean logical operations involving data values) is fundamental and commonly used. Boolean logical operations are used in many higher level operations. Consequently, speed and/or power efficiencies that can be realized with improved operations, can translate into speed and/or power efficiencies of higher order functionalities.

As shown in FIG. 8, the compute component 8148 can also comprise a latch, which can be referred to herein as a secondary latch 8190. The secondary latch 8190 can be configured and operated in a manner similar to that described above with respect to the primary latch 8175, with the exception that the pair of cross coupled p-channel transistors (e.g., PMOS transistors) included in the secondary latch can have their respective sources coupled to a supply voltage 8176-2 (e.g., $V_{DD}$), and the pair of cross coupled n-channel transistors (e.g., NMOS transistors) of the secondary latch can have their respective sources selectively coupled to a reference voltage 8176-1 (e.g., ground), such that the secondary latch is continuously enabled. The configuration of the compute component 848 is not limited to that shown in FIG. 8, and various other embodiments are feasible.

As described herein, a memory device (e.g., 720 in FIG. 7A) can be configured to couple to a host (e.g., 702) via a data bus (e.g., 756) and a control bus (e.g., 754). A bank 7146 in the memory device 720 can include a plurality of bank sections (7150-1, . . . , 7150-N in FIG. 7) of memory cells. The bank 7146 can include sensing circuitry (e.g., 7138 in FIG. 7A and corresponding reference numbers in FIGS. 8 and 9) coupled to the plurality of arrays via a plurality of columns (FIG. 7) of the memory cells. The sensing circuitry can include a sense amplifier and a compute component (e.g., 8170 and 8148, respectively, in FIG. 8) coupled to each of the columns.

Each bank section 7150 can be associated with a plurality of logic stripes (e.g., 7152-0, 7152-1, . . . , 7152-N−1 in FIG. 7B) in a compute unit in a data path of a plurality of shared I/O lines (744 in FIG. 7B) local to array 825. A controller (e.g., 740 in FIGS. 7A-7B) coupled to the bank can be configured to direct, as described herein, movement of data values to a compute component 10148 (FIG. 10A) in a logic stripe 10152 (FIG. 10A) in a compute unit 998/10198 (FIGS. 9 and 10A-10B) in a data path of a shared I/O line 9144/10144 (FIGS. 9 and 10A) local to the array.

Figure 9:
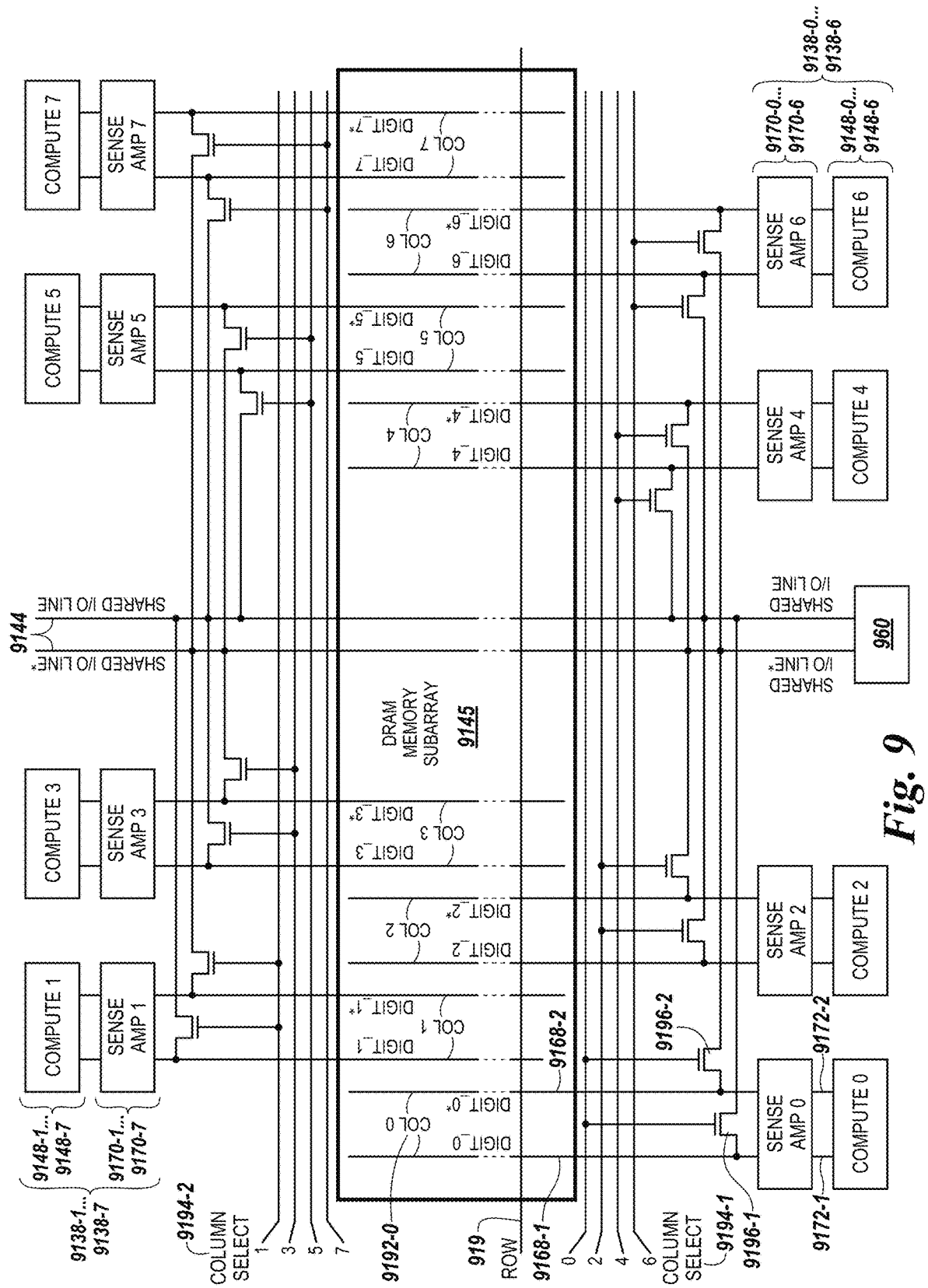
FIG. 9 is a schematic diagram illustrating circuitry for a plurality of shared I/O lines in a data path of an array in accordance with a number of embodiments of the present disclosure.

The memory device can include a logic stripe (e.g., 7152 in FIG. 7B and 10152 in FIG. 10A) having a plurality of compute components (e.g., 10148-1, . . . , 10148-Z, respectively in FIG. 10A) that can correspond to a number of the plurality of columns (FIG. 7B) of the memory cells. As discussed further in connection with FIG. 8, the number of sense amplifiers 8170 and/or compute components 8148 in sensing circuitry 8138 can be selectably coupled (e.g., via column select circuitry 9194-1 and 9194-2 in FIG. 9) to a plurality of shared I/O lines 9144 (FIG. 9). The column select circuitry can be configured to selectably sense data in a particular column of memory cells of an array by being selectably coupled to a plurality of (e.g., four, eight, and sixteen, among other possibilities) sense amplifiers and/or compute components.

In some embodiments, a number of a plurality of logic stripes (e.g., 7152-1, . . . , 752-N in FIG. 7B) in a bank can correspond to a number of bank sections 7150-1, . . . , 7150-N in FIG. 7B (e.g., a quadrant having a plurality of subarrays) in the bank. A logic stripe can include a plurality of compute components 10148-1, . . . , 109148-Z (FIG. 109A) in a data path of a shared I/O local 109144 (FIG.

109A) to the array 85 that are like compute components 78148 shown in FIG. 8. As will be shown in FIG. 9 data values sensed from a row of the array can be moved in parallel by column select logic via a plurality of shared I/O lines 9144 (FIG. 9) to a plurality of compute components 10148 (FIG. 109A) in a compute unit 9198 (FIG. 9) a data path of the plurality of shared I/O lines 944 (FIG. 89). In some embodiments, the amount of data can correspond to at least a thousand bit width of the plurality of shared I/O lines.

As described herein, the array of memory cells can include an implementation of DRAM memory cells where the controller is configured, in response to a command, to move (e.g., copy, transfer, and/or transport) data from the source location to the destination location via a shared I/O line. In various embodiments, the source location can be in a first bank and the destination location can be in a compute unit 9198 (FIG. 9 in a data path of the shared I/O lines 9144 (FIG. 9) local to the array 825.

As described in FIG. 8, the apparatus can be configured to move (e.g., copy, transfer, and/or transport) data from a source location, including a particular row (e.g., 919 in FIG. 9) and column address associated with a first number of sense amplifiers and compute components to a shared I/O line (e.g., 9144 in FIG. 9). In addition, the apparatus can be configured to move the data to a destination location, including a particular logic stripe 10152 (FIG. 10A) associated with a compute unit 10198 (FIG. 10) in a data path of the shared I/O line 10194 (FIG. 10A). As the reader will appreciate, each shared I/O line 10144 (FIG. 10A) can actually include a complementary pair of shared I/O lines (e.g., shared I/O line and shared I/O line* in FIG. 9). In some embodiments described herein, 2048 shared I/O lines (e.g., complementary pairs of shared I/O lines) can be configured as a 2048 bit wide shared I/O line. In some embodiments described herein, 1024 shared I/O lines (e.g., complementary pairs of shared I/O lines) can be configured as a 1024 bit wide shared I/O line.

FIG. 9 is a schematic diagram illustrating circuitry for data movement in a memory device in accordance with a number of embodiments of the present disclosure. FIG. 9 shows eight sense amplifiers (e.g., sense amplifiers 0, 1, . . . , 7 shown at 9170-0, 9170-1, . . . , 9170-7, respectively) each coupled to a respective pair of complementary shared I/O lines 9144 (e.g., shared I/O line and shared I/O line*). FIG. 9 also shows eight compute components (e.g., compute components 0, 1, . . . , 7 shown at 9148-0, 9148-1, . . . , 9148-7) each coupled to a respective sense amplifier (e.g., as shown for sense amplifier 0 at 9170-0) via respective pass gates 9172-1 and 9172-2 and digit lines 9168-1 and 9168-2. For example, the pass gates can be connected as shown in FIG. 2 and can be controlled by an operation selection signal, Pass. For example, an output of the selection logic can be coupled to the gates of the pass gates 9172-1 and 9172-2 and digit lines 9168-1 and 9168-2. Corresponding pairs of the sense amplifiers and compute components can contribute to formation of the sensing circuitry indicated at 9138-0, 9138-1, . . . , 9138-7.

Data values present on the pair of complementary digit lines 9168-1 and 9168-2 can be loaded into the compute component 9148-0 as described in connection with FIG. 7. For example, when the pass gates 9172-1 and 9172-2 are enabled, data values on the pair of complementary digit lines 9168-1 and 9168-2 can be passed from the sense amplifiers to the compute component (e.g., 9170-0 to 9148-0). The data values on the pair of complementary digit lines 9168-1 and 9168-2 can be the data value stored in the sense amplifier 9170-0 when the sense amplifier is fired.

The sense amplifiers 9170-0, 9170-1, . . . , 9170-7 in FIG. 9 can each correspond to sense amplifier 8170 shown in FIG. 8. The compute components 9148-0, 8148-1, . . . , 9148-7 shown in FIG. 9 can each correspond to compute component 8148 shown in FIG. 8. A combination of one sense amplifier with one compute component can contribute to the sensing circuitry (e.g., 9138-0, 9138-1, . . . , 9138-7) of a portion of a DRAM memory subarray 9145 coupled to a shared I/O line 9144 shared by a number of logic stripes in a data path of the shared I/O lines 9144.

The configurations of embodiments illustrated in FIG. 9 are shown for purposes of clarity and are not limited to these configurations. For instance, the configuration illustrated in FIG. 9 for the sense amplifiers 9170-0, 9170-1, . . . , 9170-7 in combination with the compute components 9148-0, 9148-1, . . . , 9148-7 and the shared I/O line 9144 is not limited to half the combination of the sense amplifiers 9170-0, 9170-1, . . . , 9170-7 with the compute components 9148-0, 9148-1, . . . , 9148-7 of the sensing circuitry being formed above the columns 9192 of memory cells (not shown) and half being formed below the columns 9192 of memory cells. Nor are the number of such combinations of the sense amplifiers with the compute components forming the sensing circuitry configured to couple to a shared I/O line limited to eight. In addition, the configuration of the shared I/O line 9144 is not limited to being split into two for separately coupling each of the two sets of complementary digit lines 9168-1 and 9168-2, nor is the positioning of the shared I/O line 9144 limited to being in the middle of the combination of the sense amplifiers and the compute components forming the sensing circuitry (e.g., rather than being at either end of the combination of the sense amplifiers and the compute components).

The circuitry illustrated in FIG. 9 also shows column select circuitry 9194-1 and 9194-2 that is configured to implement data movement operations with respect to particular columns 9192 of a subarray 9145, the complementary digit lines 9168-1 and 9168-2 associated therewith, and the shared I/O line 9144 (e.g., as directed by the controller 640 shown in FIGS. 6A-6B). For example, column select circuitry 9194-1 has select lines 0, 2, 4, and 6 that are configured to couple with corresponding columns, such as column 0 (332-0), column 2, column 4, and column 6. Column select circuitry 9194-2 has select lines 1, 3, 5, and 7 that are configured to couple with corresponding columns, such as column 1, column 3, column 5, and column 7. The column select circuitry 9194 described in connection with FIG. 3 can, in various embodiments, represent at least a portion of the functionality embodied by and contained in multiplexers, e.g., an eight (8) way multiplexer, sixteen (16) way multiplexer, etc.

Controller 940 can be coupled to column select circuitry 9194 to control select lines (e.g., select line 0) to access data values stored in the sense amplifiers, compute components, and/or present on the pair of complementary digit lines (e.g., 9168-1 and 9168-2 when selection transistors 9196-1 and 9196-2 are activated via signals from select line 0). Activating the selection transistors 9196-1 and 9196-2 (e.g., as directed by the controller 540) enables coupling of sense amplifier 9170-0, compute component 9148-0, and/or complementary digit lines 9168-1 and 9168-2 of column 0 (9192-0) to move data values on digit line 0 and digit line 0* to shared I/O line 9144. For example, the moved data values may be data values from a particular row 919 stored (cached) in sense amplifier 9170-0 and/or compute component 9148-0. Data values from each of columns 0 through 7 can similarly be selected by the controller activating the appropriate selection transistors.

Moreover, enabling (e.g., activating) the selection transistors (e.g., selection transistors 9196-1 and 9196-2) can enable a particular sense amplifier and/or compute component (e.g., 9170-0 and/or 9148-0, respectively) to be coupled with a shared I/O line 9144 such that data values stored by an amplifier and/or compute component can be moved to (e.g., placed on and/or transferred to) the shared I/O line 9144. In some embodiments, one column at a time is selected (e.g., column 9192-0) to be coupled to a particular shared I/O line 9144 to move (e.g., copy, transfer, and/or transport) the stored data values. In the example configuration of FIG. 9, the shared I/O line 9144 is illustrated as a shared, differential/O line pair (e.g., shared/O line and shared/O line*). Hence, selection of column 0 (9192-0) could yield two data values (e.g., two bits with values of 0 and/or 1) from a row (e.g., row 919) and/or as stored in the sense amplifier and/or compute component associated with complementary digit lines 9168-1 and 9168-2. These data values could be input in parallel to each shared, differential/O pair (e.g., shared I/O and shared I/O*) of the shared differential/O line 9144.

FIG. 10A is a block diagram illustrating one of a plurality of sections 10150 of an array 1025 coupled to a compute unit 10198, having a plurality of logic stripes 10152-1, . . . , 10152-N, by a plurality of shared/O lines 10144 in a data path local to the array 1025. In the example embodiment of FIG. 10A a bank section 10150 (e.g., bank quadrant) is shown having a plurality of subarrays 10145-1, . . . , 10145-32. In FIG. 10A, thirty-two (32) subarrays are illustrated in a bank quadrant 10150. However, embodiments are not limited to this example. This example shows a bank section having 16K columns which are multiplexed by sixteen (16) to the shared I/O lines 10144. Thus, 16K columns are multiplexed to 1K shared/O lines 10144 such that every 16 columns can provide a data value that can be moved to the compute unit 10198 as a group of 1024 (1K) bits in parallel. Here, the shared/0 lines 10144 provide a 1K bit wide data path to the compute unit 10198.

In the example of FIG. 10A, each logic stripe 10152-1, . . . , 10152-N has a plurality of compute components 10148-1, . . . , 10148-Z as the same have been described herein in connection with the sensing circuitry 7138 of FIG. 7. In some embodiments, each of the plurality of logic stripes 10152-1, . . . , 10152-N is configured to perform a compute function using the plurality of compute components 10148-1, . . . , 10148-Z. In some embodiments, each of the plurality of logic stripes 10152-1, . . . , 10152-Z can perform a different logical operation using the plurality of compute components 10148-1, . . . , 10148-Z. For example, in some embodiments at least one of the plurality of logic stripes 10152-1, . . . , 10152-Z can be configured to perform a long shift accelerator operation, e.g., eight (8) sixty-four (64) bit barrel shifter operation. This example could also provide a partial reorder in eight (8) bit chunks and could support a gather/scatter operation, in chunks of 256 bits with an 8 bit cross bar. In another example, in some embodiments at least one of the plurality of logic stripes 10152-1, . . . , 10152-Z can be configured to perform Kogge-Stone acceleration to generate a partial carry look ahead to accelerate a horizontal add. In another example, in some embodiments at least one of the plurality of logic stripes 10152-1, . . . , 10152-Z can be configured to perform "chunk" math acceleration. This example could provide vertical mode acceleration in small groups of bits (e.g., 4 or 8 bit chunks). In another example, in some embodiments the plurality of logic stripes 10152-1, . . . , 10152-Z can be configured to function as an explicit mask register to implement Boolean operations as would be used by a compiler. As used herein, a "chunk" is intended to reference a smaller bit length than an addressed row of data, e.g., a 256 bit chunk (within a 128 byte addressable row) may be addressed to match a bit width to a particular interface. This may be desirable to match a 256 bit interface of a 16K+ column memory array.

According to embodiments, the controller 540 (FIG. 5A) associated with the bank section can execute microcode instructions to direct movement of the 1K bit data values in parallel from each multiplexed column in connection with a particular accessed row among the plurality of subarrays 10145-1, . . . , 10145-32 to a particular compute component 10148-1, . . . , 10148-Z of a particular logic stripe 10152-1, . . . , 10152-N in the compute unit 10198.

According to some embodiments, a butterfly network 10202 can be used to connect the 1K bit data values to a respective one of the plurality of compute components 10148-1, . . . , 10148-Z in a respective one of the plurality of logic stripes 10152-1, . . . , 10152-N. By way of example, and not by way of limitation, 1K bits of data values can be moved in parallel to a logic strip associate with each of the 32 subarrays 10145-1, . . . , 10145-32 in each of 4 quadrants to a bank section 10150. In this example, 128 logic stripes 10152-1, . . . , 10152-N having 1K compute components 10148-1, . . . , 10148-Z each can be included in the compute unit 10198. Data values loaded to the plurality of compute components 10148-1, . . . , 10148-Z in the logic stripes 10152-1, . . . , 10152-N of the compute unit 10198 can be operated on according to microcode instructions from the controller 840 (FIG. 8A) to perform operations, e.g., AND, OR, NOR, XOR, add, subtract, multiply, divide, etc., on the data values as the same have been described herein in connection with the sensing circuitry 7138 of FIG. 7. As noted above, once the data values are loaded to the compute unit 10198, compute operations may be controlled in the compute unit much faster, e.g., at speeds of approximately 2 nanoseconds (ns), according to microcode instructions executed by the controller 640 (FIG. 6A) without having to move the data values back into the rows of the array 525 (FIG. 5A). For example, compute operations may be performed using the compute unit 10198 at a much faster speed as compared to an example time, e.g., approximately 60 nanoseconds (ns), that may be required to fire and access rows in the array 625 (FIG. 6A).

In the example embodiment of FIG. 10A, the plurality of compute components 10148-1, . . . , 10148-Z and/or logic stripes 10152-1, . . . , 10152-N in the compute unit 10198, in the data path of the plurality of shared I/O lines 10144, have a pitch equal to that of the data path of a shared I/O line. According to embodiments, the pitch of the data path is a function, e.g., multiple (2×, 4×, etc.), of a pitch of digit lines to the array 525 (FIG. 5A) of memory cells. For example, the plurality of compute components 10148-1, . . . , 10148-Z and/or logic stripes 10152-1, . . . , 10152-N have a pitch that is an integer multiple of the pitch of digit lines to the array of memory cells.

FIG. 10B is a block diagram example illustrating a plurality of arrays coupled to a plurality of compute components in a compute unit by a plurality of shared I/O lines in a data path local to the arrays where the compute component has a pitch equal to that of the data path of a shared I/O line and which is a multiple of a pitch of the digit lines to the array. The example of FIG. 10B illustrates a plurality of arrays, e.g., bank quadrants 10150-1, 10150-2, sections of arrays, etc., which may have memory cells accessed by digit lines 10168.

In the example of FIG. 10B, the bank quadrants 10150-1 and 10150-2 are shown having a pitch that is approximately sixteen thousand (16K) digit lines 10168 wide according to a given feature dimension (design rule) of a digit line fabrication process. Also shown are a plurality of shared I/O lines 10144-1, 10144-2, . . . , 10144-Z which can have a different pitch that is a function, e.g., multiple, of the given feature dimension (design rule) of the digit line fabrication process. In the example of FIG. 10B, the data path of the plurality of shared I/O lines 10144-1, 10144-Z have a pitch that is approximately sixteen (16) times greater than that of the digit lines 10168. Hence in this example, there are shown approximately one thousand (1K) shared I/O lines 10144-1, . . . , 10144-Z multiplexed to the 16K digit lines 10168 through 16:1 multiplexors, e.g., 10204-1, . . . , 10204-Z and 10206-1, . . . , 10206-Z, respectively. Embodiments, however, are not limited to the numerical example provided here and more or fewer digit lines 10168 may be multiplexed to a plurality of shared I/O lines 10144-1, . . . , 10144-Z. For example, the shared I/O lines 10144-1, . . . , 10144-Z can have a pitch that is a multiple other than 16 times (e.g., 16×) that of the pitch of the digit lines 10168 as set by a given feature dimension (design rule) of the digit line fabrication process.

As shown in the example of FIG. 10B, a compute component, e.g., among a plurality of compute components 10148-1, . . . , 10148-Z and 10149-1, . . . , 10149-Z, may be associated with each shared I/O line 10144-1, . . . , 10144-Z, respectively. The plurality of compute components 10148-1, . . . , 10148-Z and 10149-1, . . . , 10149-Z may be within a plurality of logic stripes, e.g., 10152-1, 10152-2, . . . , 10152-N shown in FIG. 10A, of a compute unit shown as 10198-1 and 10198-2, respectively. As shown in the example of FIG. 10B, a compute component, e.g., among a plurality of compute components 10148-1, . . . , 10148-Z and 10149-1, . . . , 10149-Z associated with each shared I/O line 10144-1, . . . , 10144-Z, may have a pitch that is equal to the data path of the shared I/O lines 10144-1, . . . , 10144-Z and hence sixteen times (e.g., 16×) that of the digit lines 10168 to the arrays, e.g., 10150-1 and 10150-2. According to various embodiments, since the compute components 10148-1, . . . , 10148-Z and 10149-1, . . . , 10149-Z in the data path of the shared I/O lines 10144-1, . . . , 10144-Z are not restricted in a one to one (e.g., 1× multiple) relationship with the pitch of the digit lines 8168, the compute components 10148-1, . . . , 10148-Z and 10149-1, . . . , 10149-Z are not limited to the "vertical" alignment of the arrays 10150-1 and 10150-2 and, in this example, can be sixteen times (16×) larger. As such, the compute components 10148-1, . . . , 10148-Z and 10149-1, . . . , 10149-Z in the data path of the shared IO lines 10144-1, . . . , 10144-Z can be used to perform more robust set of logical operations on data values stored therein (e.g., by having a larger footprint and space) such as the above mentioned long shift acceleration, while still being proximate to the arrays 10150-1 and 10150-1 and not off in a peripheral area of the array or memory die.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one.

Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
  a number of memory arrays configured to store at least one of: an input, an output, a weight matrix, bias information for neural networks, or activation function information for an artificial intelligence (AI) operation performed by an AI accelerator;
  a register configured to enable usage of an activation function for the AI operation;
  a number of activation function registers configured to define the activation function for the AI operation performed by the AI accelerator;
  a memory controller configured to select the defined activation function by programming a first bit of the number of activation function registers to a first state to execute an identity function for the AI operation and programming a second bit of the activation function registers to the first state to execute a binary step function for the AI operation, modify the defined activation function to a custom activation function, and enable performance of the custom activation function for the AI operation without a host by programming a third bit of the number of activation function registers to the first state in response to a result of a previous AI operation, wherein a different activation function was executed while performing the previous AI operation; and
  the AI accelerator configured to perform the AI operation using at least one of: the input, the output, the weight matrix, the bias information for the neural networks, or the activation function information and the custom activation function.

2. The apparatus of claim 1, wherein one or more of the number of activation function registers define a pre-defined activation function.

3. The apparatus of claim 1, wherein one or more of the number of activation function registers define a different custom activation function.

4. The apparatus of claim 2, wherein the pre-defined activation function is at least one of the identity function, the binary step function, a logistic function, a hyperbolic tangent function, an inverse tangent function, a softsign function, an inverse square root unit function, a rectified linear unit function, a leaky rectified linear unit function, parametric rectified linear unit function, a randomized leaky rectified linear unit function, an exponential linear unit function, or a scaled exponential linear unit function.

5. The apparatus of claim 3, wherein the different custom activation function is based on the result of the previous AI operation.

6. The apparatus of claim 5, wherein the previous AI operation is a debug operation.

7. The apparatus of claim 3, wherein the different custom activation function is modified from a pre-defined activation function.

8. An apparatus, comprising:
   a number of memory arrays configured to store at least one of: an input, an output, a weight matrix, bias information for neural networks, or activation function information for an artificial intelligence (AI) operation performed by an AI accelerator;
   a register configured to enable usage of an activation function for the AI operation;
   a memory controller configured to select the activation function by programming a first bit of an activation function register to a first state to execute an identity function for the AI operation and programming a second bit of the activation function register to the first state to execute a binary step function for the AI operation, modify the activation function to a custom activation function, and cause the apparatus to enable performance of the custom activation function for the AI operation without a host by programming a third bit in the activation function register to the first state in response to receiving a result of a previous AI operation, wherein a different activation function was executed while performing the previous AI operation; and
   the AI accelerator configured to perform the AI operation using at least one of: the input, the output, the weight matrix, the bias information for the neural networks, or the activation function information and the custom activation function.

9. The apparatus of claim 8, wherein the activation function is a pre-defined activation function.

10. The apparatus of claim 9, wherein the third bit of the activation function register is programmed to the first state to start the custom activation function.

11. The apparatus of claim 10, wherein the third bit of the activation function register is programmed to a second state to stop the custom activation function.

12. The apparatus of claim 10, wherein the third bit of the activation function register is programmed to a second state to prevent the custom activation function from being executed.

13. A method, comprising:
   storing at least one of: an input, an output, a weight matrix, bias information for neural networks, or activation function information for an artificial intelligence (AI) operation performed by an AI accelerator in a number of memory arrays;
   enabling usage of an activation function for the AI operation using a register;
   executing the activation function while performing the AI operation at the AI accelerator using at least one of: the input, the output, the weight matrix, the bias information for the neural networks, or the activation function information; and
   selecting a different activation function by programming a first bit of an activation function register to a first state to execute an identity function for the AI operation and programming a second bit of the activation function register to the first state to execute a binary step function for the AI operation, modifying the different activation function to a custom activation function, and executing the custom activation function by a memory controller without a host in response to a result of the AI operation by programming a third bit in the activation function register to the first state.

14. The method of claim 13, further comprising executing the custom activation function while performing a different AI operation.

15. The method of claim 13, further comprising updating the different activation function in response to the result of the AI operation.

16. The method of claim 13, wherein the different activation function is a pre-defined activation function.

17. The method of claim 13, wherein the AI operation is a debug operation.

* * * * *